United States Patent
Onuki et al.

(10) Patent No.: US 10,535,688 B2
(45) Date of Patent: Jan. 14, 2020

(54) IMAGING DEVICE AND IMAGING SYSTEM

(71) Applicant: CANON KABUSHIKI KAISHA, Tokyo (JP)

(72) Inventors: Yusuke Onuki, Fujisawa (JP); Mahito Shinohara, Tokyo (JP); Hajime Ikeda, Yokohama (JP); Takafumi Miki, Yokohama (JP); Hiroshi Sekine, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/259,451

(22) Filed: Jan. 28, 2019

(65) Prior Publication Data

US 2019/0252432 A1    Aug. 15, 2019

(30) Foreign Application Priority Data

Feb. 15, 2018 (JP) ................. 2018-024935

(51) Int. Cl.
*H01L 27/146* (2006.01)
*H04N 5/3745* (2011.01)
(Continued)

(52) U.S. Cl.
CPC .. *H01L 27/14612* (2013.01); *H01L 27/14643* (2013.01); *H01L 27/14689* (2013.01);
(Continued)

(58) Field of Classification Search
CPC ......... H01L 27/14612; H01L 27/14689; H01L 27/14643; H01L 27/14605;
(Continued)

(56) References Cited

U.S. PATENT DOCUMENTS 4,962,412 A    10/1990    Shinohara
5,008,206 A     4/1991    Shinohara
(Continued)

FOREIGN PATENT DOCUMENTS

WO    2011/043432    4/2011

OTHER PUBLICATIONS

U.S. Appl. No. 16/146,173, filed Sep. 28, 2018, by Mahito Shinohara.
(Continued)

*Primary Examiner* — Yogesh K Aggarwal
(74) *Attorney, Agent, or Firm* — Venable LLP

(57) ABSTRACT

An imaging device includes pixels each including a photoelectric converter that generates charges by photoelectric conversion, a first transfer transistor that transfers charges of the photoelectric converter to a first holding portion, a second transfer transistor that transfers charges of the first holding portion to a second holding portion, and an amplifier unit that outputs a signal based on charges held by the second holding portion. The first transfer transistor is configured to form a potential well for the charges between the photoelectric converter and the first holding portion when the first transistor is in an on-state. The maximum charge amount $Q_{PD}$ generated by the photoelectric converter during one exposure period, a saturation charge amount $Q_{MEM\_SAT}$ of the first holding portion, and the maximum charge amount $Q_{GS}$ that can be held in the potential well are in a relationship of: $Q_{PD} < Q_{GS} \leq Q_{MEM\_SAT}$.

12 Claims, 13 Drawing Sheets

(51) Int. Cl.
  *H04N 5/378* (2011.01)
  *H04N 5/369* (2011.01)
  *H04N 5/359* (2011.01)

(52) U.S. Cl.
  CPC ....... *H04N 5/3597* (2013.01); *H04N 5/36961* (2018.08); *H04N 5/378* (2013.01); *H04N 5/37455* (2013.01)

(58) Field of Classification Search
  CPC ............ H01L 27/14609; H04N 5/3597; H04N 5/36961; H04N 5/378; H04N 5/37455; H04N 2209/041; H04N 23/006; H04N 5/3745
  USPC ........ 348/294–324; 250/208.1; 257/290–292
  See application file for complete search history.

(56) References Cited

U.S. PATENT DOCUMENTS

| | | | |
|---|---|---|---|
| 5,060,042 A | 10/1991 | Shinohara | |
| 5,086,326 A | 2/1992 | Shinohara | |
| 5,146,339 A | 9/1992 | Shinohara | |
| 5,280,358 A | 1/1994 | Yushiya | |
| 6,828,601 B2 | 12/2004 | Shinohara | |
| 6,876,019 B2 | 4/2005 | Shinohara | |
| 7,250,970 B2 | 7/2007 | Shinohara | |
| 7,394,492 B2 | 7/2008 | Shinohara | |
| 7,741,593 B2 | 6/2010 | Iwata | |
| 7,821,551 B2 | 10/2010 | Shinohara | |
| 7,884,870 B2 | 2/2011 | Shinohara | |
| 8,063,966 B2 | 11/2011 | Shinohara | |
| 8,115,848 B2 | 2/2012 | Onuki | |
| 8,139,133 B2 | 3/2012 | Iwane | |
| 8,164,668 B2 | 4/2012 | Iida | |
| 8,345,137 B2 | 1/2013 | Shinohara | |
| 8,350,942 B2 | 1/2013 | Shinohara | |
| 8,427,564 B2 | 4/2013 | Yamashita | |
| 8,471,942 B2 | 6/2013 | Shinohara | |
| 8,736,734 B2 | 5/2014 | Onuki | |
| 8,896,734 B2 | 11/2014 | Shinohara | |
| 8,970,769 B2 | 3/2015 | Shinohara | |
| 9,437,647 B2 | 9/2016 | Shinohara | |
| 9,716,849 B2 | 7/2017 | Kobayashi | |
| 9,894,295 B2 | 2/2018 | Kawabata | |
| 10,009,560 B2 | 6/2018 | Kobayashi | |
| 10,021,321 B2 | 7/2018 | Kawabata | |
| 10,057,519 B2 | 8/2018 | Kobayashi | |
| 10,186,532 B2 | 1/2019 | Kobayashi | |
| 10,205,894 B2 | 2/2019 | Kawabata | |
| 2005/0253946 A1 | 11/2005 | Shinohara | |
| 2010/0140732 A1* | 6/2010 | Eminoglu | H01L 27/14634 257/447 |
| 2012/0193692 A1 | 8/2012 | Kawahito | |
| 2013/0206965 A1 | 8/2013 | Yamashita | |
| 2016/0071893 A1 | 3/2016 | Shinohara | |
| 2017/0212221 A1 | 7/2017 | Goden | |
| 2017/0294470 A1 | 10/2017 | Takami | |
| 2017/0359538 A1 | 12/2017 | Kobayashi | |
| 2018/0151616 A1 | 5/2018 | Sekine | |
| 2018/0184027 A1 | 6/2018 | Shinohara | |
| 2018/0213167 A1 | 7/2018 | Miki | |
| 2018/0213169 A1 | 7/2018 | Onuki | |
| 2018/0277575 A1 | 9/2018 | Ikeda | |
| 2018/0295302 A1 | 10/2018 | Kobayashi | |
| 2018/0374886 A1 | 12/2018 | Iwata | |
| 2019/0037161 A1 | 1/2019 | Ikeda | |

OTHER PUBLICATIONS

U.S. Appl. No. 16/221,763, filed Dec. 17, 2018, by Mahito Shinohara.
U.S. Appl. No. 16/215,783, filed Dec. 11, 2018, by Hiroshi Sekine.

\* cited by examiner

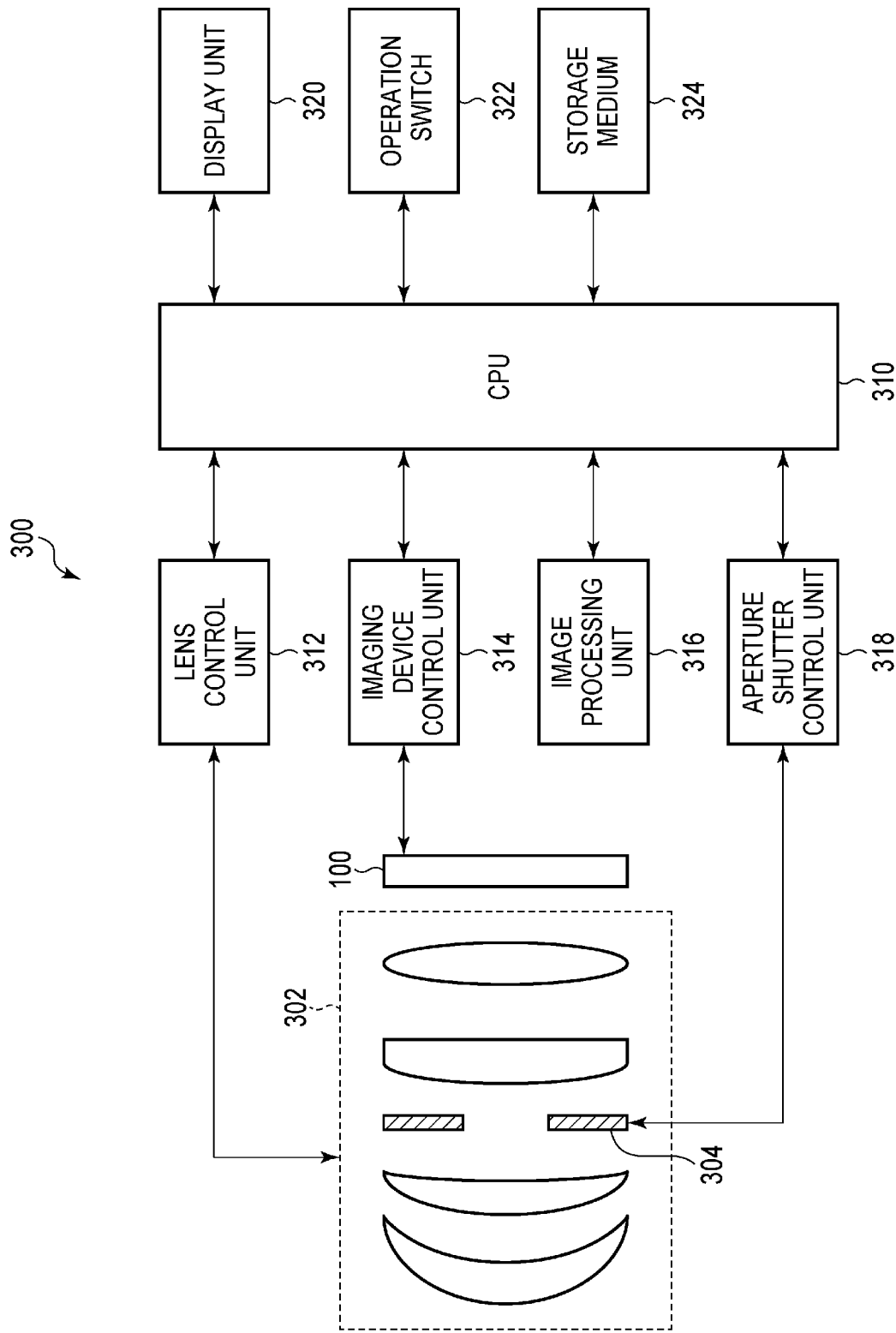

IMAGING DEVICE AND IMAGING SYSTEM

BACKGROUND OF THE INVENTION

Field of the Invention

The present invention relates to an imaging device and an imaging system.

Description of the Related Art

In recent years, image capturing by performing a global electronic shutter operation has been proposed in CMOS image sensors. The global electronic shutter operation is a drive method that performs capturing so that exposure periods are the same among the plurality of pixels, which provides an advantage that an object image is less likely to be distorted even when an object moving fast is captured. International Publication No. WO2011/043432 discloses an imaging device in which, as a configuration for implementing a function of global electronic shutter, a charge holding portion is provided separately from a photoelectric converter and a floating diffusion within a pixel.

The configuration in which a charge holding portion is provided within a pixel to implement a function of global electronic shutter may cause various problems in a process of transferring signal charges from a photoelectric converter to a charge holding portion via a transfer transistor. For example, when signal charges generated by a photoelectric converter are transferred to a charge holding portion, in a process of switching the transfer transistor from an on-state back to an off-state, a phenomenon in which a part of signal charges returns to the photoelectric converter may occur. In view of the above, in International Publication No. WO2011/043432, a potential step is provided so as to have a shoulder part on the photoelectric converter side in a portion from the photoelectric converter side to the charge holding portion side below the gate electrode of the transfer transistor, and this suppresses a reverse flow of signal charges to the photoelectric converter side.

However, the art disclosed in International Publication No. WO2011/043432 is not necessarily sufficient to suppress a reverse flow of charges to the photoelectric converter side when a particular configuration of the portion from the photoelectric converter to the charge holding portion or a particular driving scheme of the imaging device is employed.

SUMMARY OF THE INVENTION

The present invention intends to provide an imaging device that can effectively suppress a reverse flow of charges when signal charges are transferred from a photoelectric converter to a charge holding portion.

According to one aspect of the present invention, there is provided an imaging device including a plurality of pixels each including a photoelectric converter that generates charges by photoelectric conversion, a first transfer transistor that transfers charges of the photoelectric converter to a first holding portion, a second transfer transistor that transfers charges of the first holding portion to a second holding portion, and an amplifier unit that outputs a signal based on charges held by the second holding portion, wherein the first transfer transistor is configured to form a potential well for the charges between the photoelectric converter and the first holding portion when the first transistor is in an on-state, and the maximum charge amount $Q_{PD}$ generated by the photoelectric converter during one exposure period, a saturation charge amount $Q_{MEM\_SAT}$ of the first holding portion, and the maximum charge amount $Q_{GS}$ that can be held in the potential well are in a relationship of: $Q_{PD}<Q_{GS}\leq Q_{MEM\_SAT}$.

Further features of the present invention will become apparent from the following description of exemplary embodiments with reference to the attached drawings.

BRIEF DESCRIPTION OF THE DRAWINGS

FIG. 12 is a block diagram illustrating a general configuration of an imaging system according to a fourth embodiment of the present invention.

DESCRIPTION OF THE EMBODIMENTS

Preferred embodiments of the present invention will now be described in detail in accordance with the accompanying drawings.

First Embodiment

An imaging device according to a first embodiment of the present invention will be described with reference to FIG. 1 to FIG. 6D.

Figure 1:
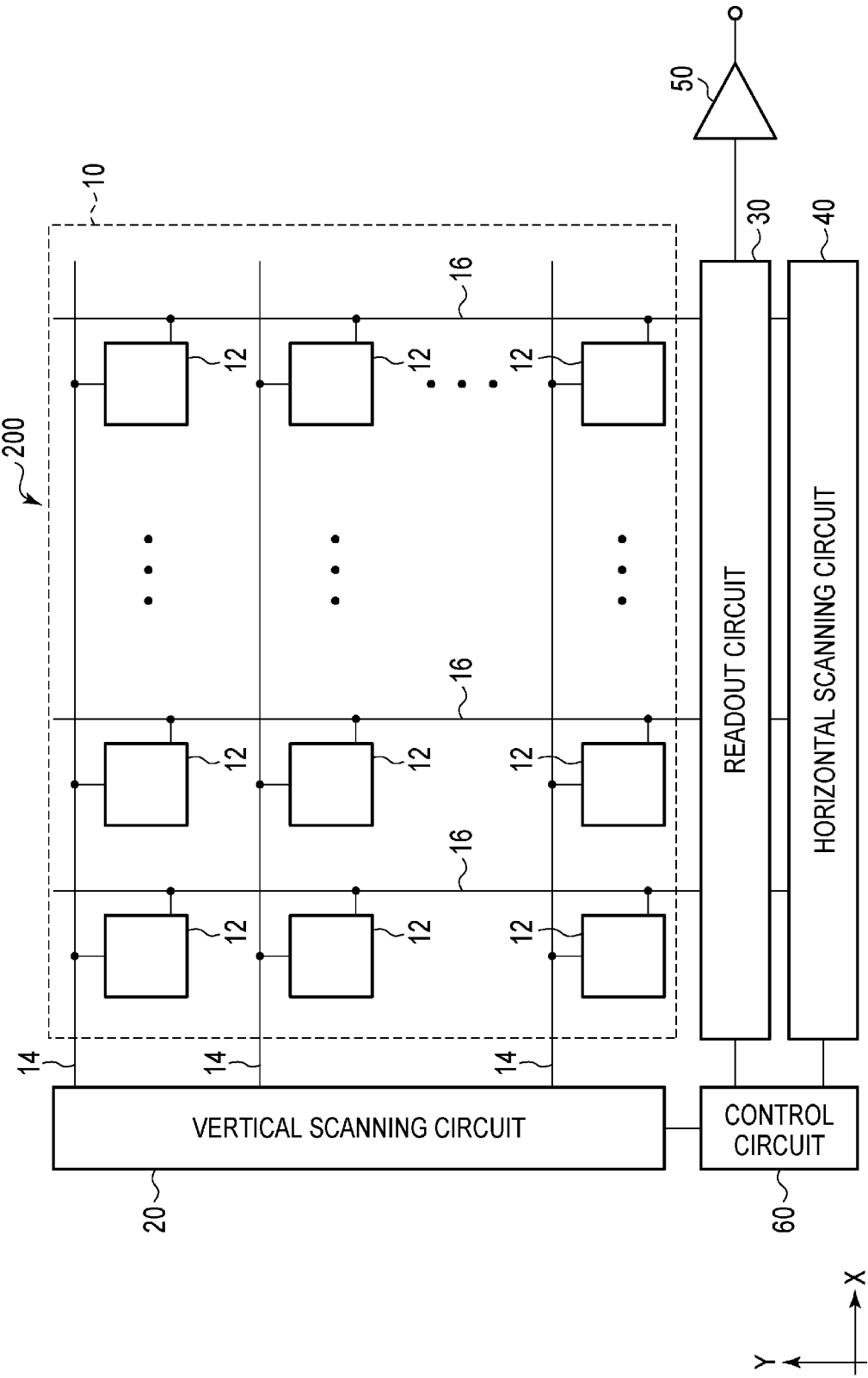
FIG. 1 is a block diagram illustrating a general configuration of an imaging device according to a first embodiment of the present invention.
Figure 2:
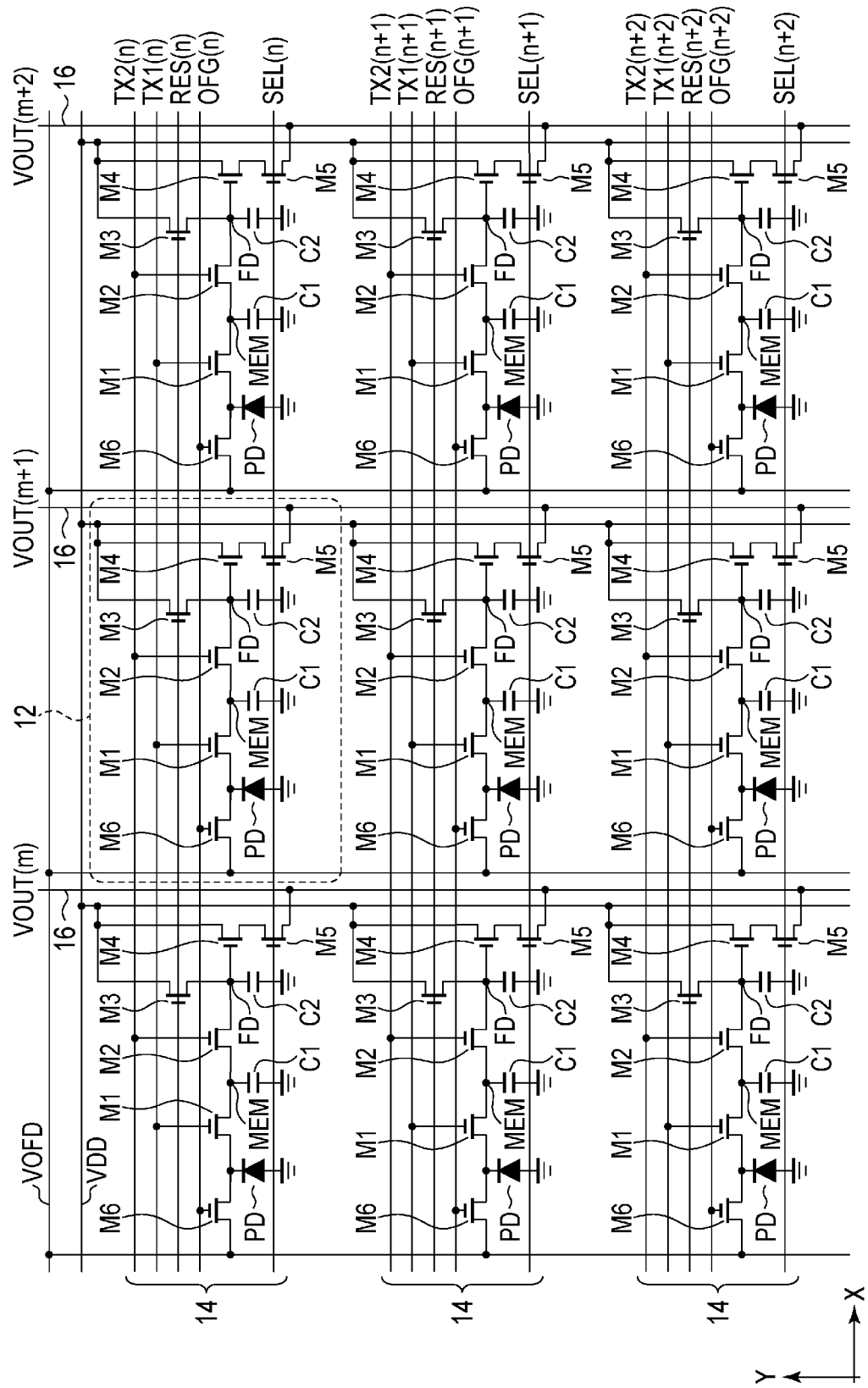
FIG. 2 is a circuit diagram illustrating a configuration example of a pixel of the imaging device according to the first embodiment of the present invention.
Figure 3:
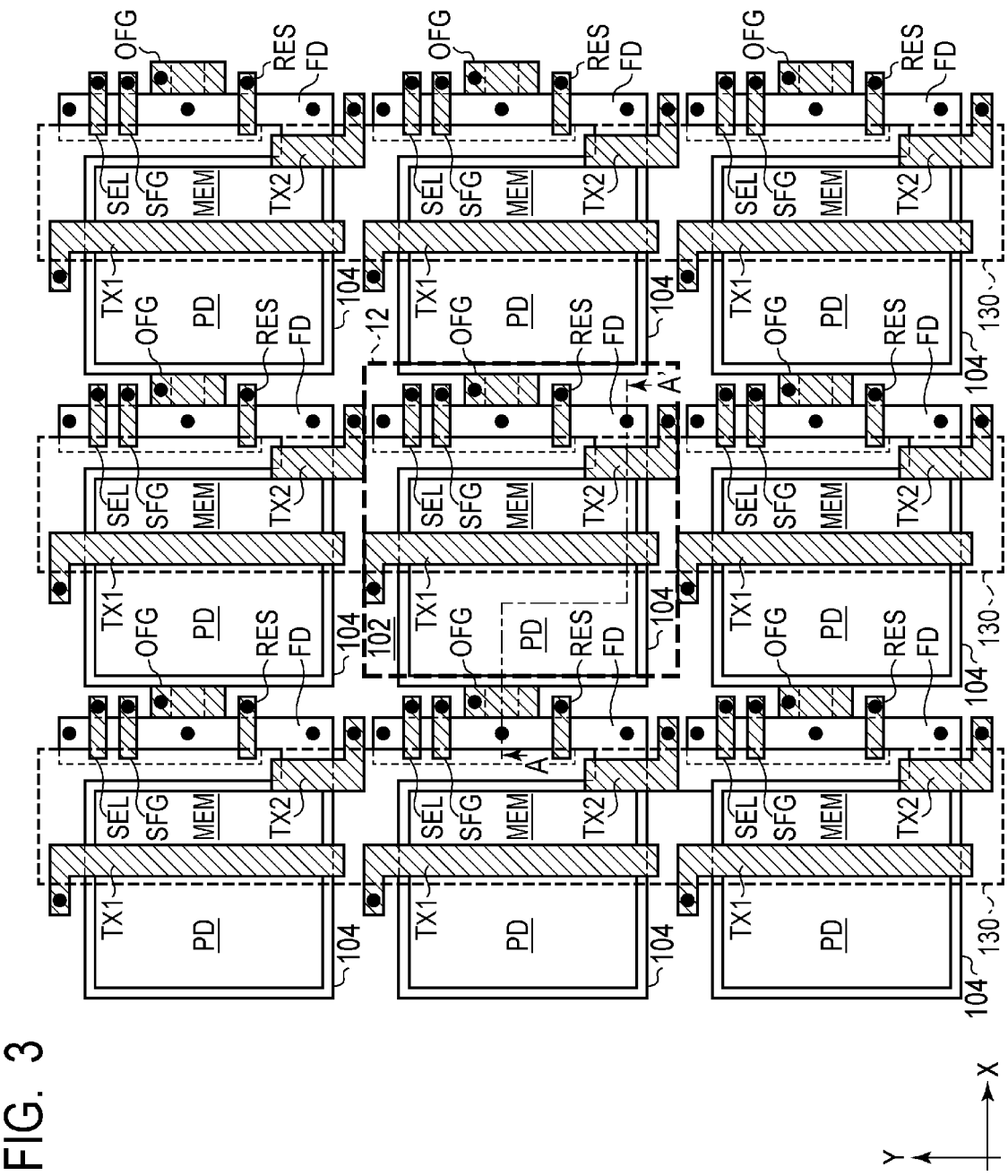
FIG. 3 is a plan view illustrating the structure of the pixel of the imaging device according to the first embodiment of the present invention.
Figure 4:
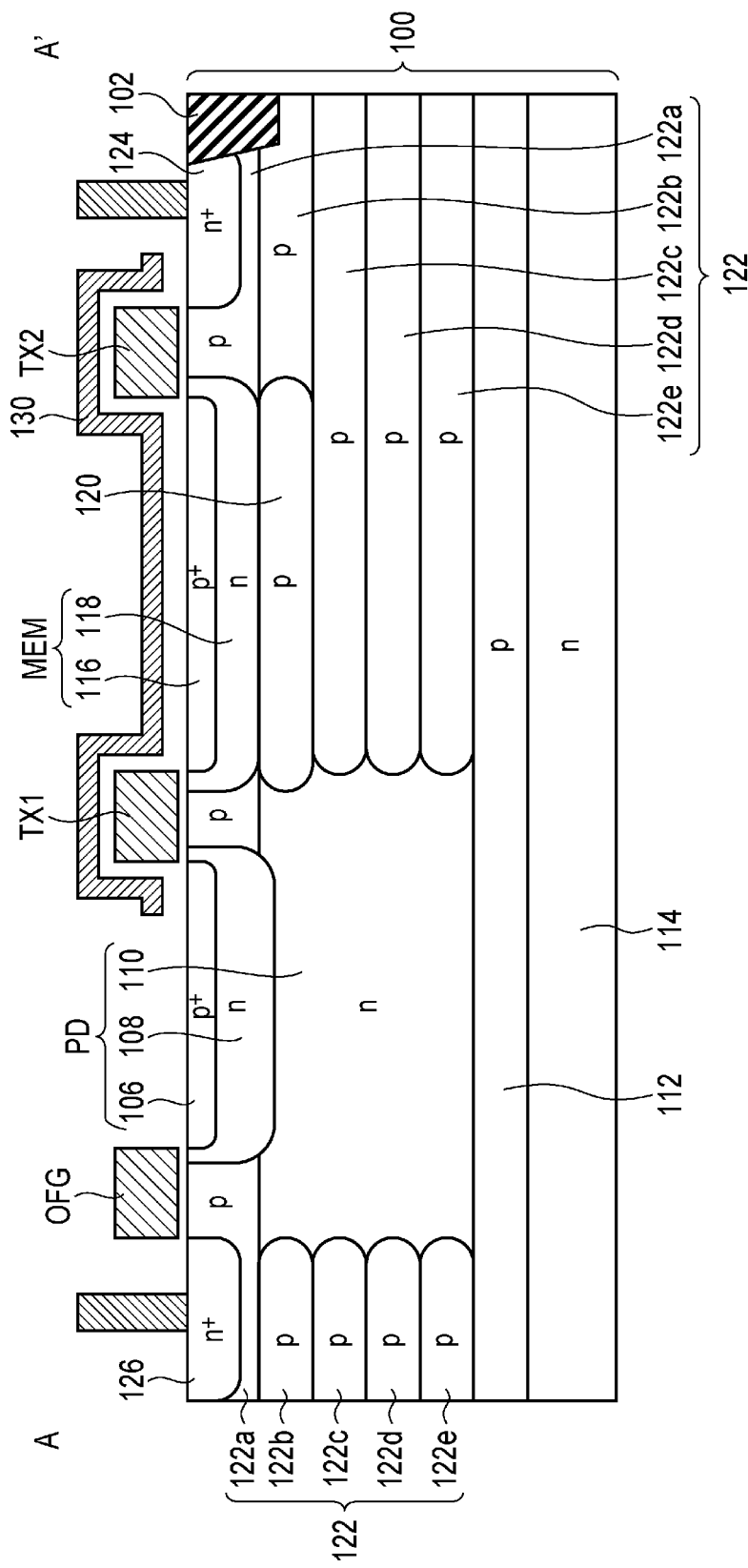
FIG. 4 is a schematic cross-sectional view illustrating the structure of the pixel of the imaging device according to the first embodiment of the present invention.

FIG. 1 is a block diagram illustrating a general configuration of the imaging device according to the present embodiment. FIG. 2 is a circuit diagram illustrating a configuration example of a pixel of the imaging device according to the present embodiment. FIG. 3 is a plan view illustrating the structure of the pixel of the imaging device according to the present embodiment. FIG. 4 is a schematic cross-sectional view illustrating the structure of the pixel of the imaging device according to the present embodiment. FIG. 5A to FIG. 5D are potential diagrams at charge transfer in the imaging device according to the present embodiment. FIG. 6A to FIG. 6D are potential diagrams at charge transfer in an imaging device according to a reference example.

As illustrated in FIG. 1, an imaging device 200 according to the present embodiment includes a pixel region 10, a vertical scanning circuit 20, a readout circuit 30, a horizontal scanning circuit 40, an output circuit 50, and a control circuit 60.

In the pixel region 10, a plurality of pixels 12 arranged in a matrix over a plurality of rows and a plurality of columns are provided. Each of the pixels 12 includes a photoelectric conversion element that converts an incident light into charges in accordance with the light amount thereof. The number of rows and the number of columns of a pixel array arranged in the pixel region 10 are not particularly limited. Further, in the pixel region 10, other pixels (not illustrated) such as an optical black pixel that is shielded from light, a dummy pixel that outputs no signal, or the like may be arranged in addition to the pixels 12 that output signals in accordance with the light amount of an incident light.

A control line 14 is arranged on each row of the pixel array of the pixel region 10 extending in a first direction (X-direction in FIG. 1). The control line 14 is connected to the pixels 12 aligned in a first direction, respectively, to form a signal line common to these pixels 12. The first direction in which the control signal line 14 extends may be denoted as the row direction or the horizontal direction. The control signal line 14 on each row is connected to the vertical scanning circuit 20.

A vertical output line 16 is arranged on each column of the pixel array of the pixel region 10 extending in a second direction intersecting the first direction (Y-direction in FIG. 1). The vertical output line 16 is connected to the pixels 12 aligned in the second direction, respectively, to form a signal line common to these pixels 12. The second direction in which the vertical output line 16 extends may be denoted as the column direction or the vertical direction. The vertical output line 16 on each column is connected to the readout circuit 30.

The vertical scanning circuit 20 is a control unit that supplies, to the pixels 12 via the control signal lines 14 provided on a row-by-row basis of the pixel array, control signals for driving the readout circuit 30 within the pixels 12 when reading out signals from respective pixels 12. The vertical scanning circuit 20 can be configured using a shift register or an address decoder. Signals read out from the pixels 12 are input to the readout circuit 30 via the vertical output lines 16 provided on each column of the pixel array.

The readout circuit 30 is a circuit unit that performs a predetermined process, for example, signal processing such as an amplification process, an addition process, or the like on the signals read out from the pixels 12. The readout circuit 30 may include signal holding units, column amplifiers, correlated double sampling (CDS) circuits, adder circuits, or the like. The readout circuit 30 may further include an analog-to-digital (A/D) converter circuit or the like if necessary.

The horizontal scanning circuit 40 is a circuit unit that supplies, to the readout circuit 30, control signals used for transferring signals processed in the readout circuit 30 to the output circuit 50 sequentially on a column-by-column basis. The horizontal scanning circuit 40 can be configured using a shift register or an address decoder. The output circuit 50 is a circuit unit that is formed of a buffer amplifier, a differential amplifier, or the like to amplify and output a signal on a column selected by the horizontal scanning circuit 40.

The control circuit 60 is a circuit unit that supplies, to the vertical scanning circuit 20, the readout circuit 30, and the horizontal scanning circuit 40, control signals for controlling the operation or the timing thereof. Some or all of the control signals supplied to the vertical scanning circuit 20, the readout circuit 30, and the horizontal scanning circuit 40 may be supplied from the outside of the imaging device 200.

FIG. 2 is a circuit diagram illustrating an example of pixel circuits forming the pixel region 10. While FIG. 2 depicts nine pixels 12 arranged in three rows by three columns out of the pixels 12 forming the pixel region 10, the number of pixels 12 forming the pixel region 10 is not particularly limited.

Each of the plurality of pixels 12 includes a photoelectric converter PD, transfer transistors M1 and M2, a reset transistor M3, a source follower transistor M4, a select transistor M5, and an overflow transistor M6.

The photoelectric converter PD is formed of a photoelectric conversion element, for example, a photodiode. The anode of the photodiode of the photoelectric converter PD is connected to a ground node, and the cathode thereof is connected to the source of the transfer transistor M1 and the source of the overflow transistor M6. The drain of the transfer transistor M1 is connected to the source of the transfer transistor M2. The connection node of the drain of the transfer transistor M1 and the source of the transfer transistor M2 includes a capacitance component and has a function of a holding portion of charges (holding portion MEM). In FIG. 2, this capacitance component is denoted as a capacitor C1, one terminal of which is connected to the node. The other terminal of the capacitor C1 is connected to the ground node.

The drain of the transfer transistor M2 is connected to the source of the reset transistor M3 and the gate of the source follower transistor M4. The connection node of the drain of the transfer transistor M2, the source of the reset transistor M3, and the gate of the source follower transistor M4 is a so-called floating diffusion FD. The floating diffusion FD includes a capacitance component (floating diffusion capacitance) and has a function of a holding portion of charges. In FIG. 2, this capacitance component is denoted as a capacitor C2, one terminal of which is connected to the floating diffusion FD. The other terminal of the capacitor C2 is connected to the ground node.

The drain of the reset transistor M3 and the drain of the source follower transistor M4 are connected to a power supply voltage line (voltage VDD). Further, the drain of the overflow transistor M6 is connected to a power supply voltage line (voltage VOFD) that functions as an overflow drain OFD. Note that any two or three of a voltage supplied to the drain of the reset transistor M3, a voltage supplied to the drain of the source follower transistor M4, and a voltage supplied to the drain of the overflow transistor M6 may be the same, or all of the above may be different. The source of the source follower transistor M4 is connected to the drain of the select transistor M5. The source of the select transistor M5 is connected to the vertical output line 16.

In the case of the pixel configuration of FIG. 2, each of the control signal lines 14 arranged in the pixel region 10 includes signal lines TX1, TX2, RES, SEL and OFG. The signal line TX1 is connected to the gates of the transfer transistors M1 of the pixels 12 belonging to the corresponding row, respectively, and forms a signal line common to these pixels 12. The signal line TX2 is connected to the gates of the transfer transistors M2 of the pixels 12 belonging to the corresponding row, respectively, and forms a signal line common to these pixels 12. The signal line RES is connected to the gates of the reset transistors M3 of the pixels 12 belonging to the corresponding row, respectively, and forms a signal line common to these pixels 12. The signal line SEL is connected to the gates of the select transistors M5 of the pixels 12 belonging to the corresponding row, respectively, and forms a signal line common to these pixels 12. The signal line OFG is connected to the gates of the overflow transistors M6 of the pixels 12 belonging to the corresponding row, respectively, and forms a signal line common to these pixels 12. Note that, in FIG. 2, the corresponding row number is provided to the name of each control line (for example, TX1(n), TX1(n+1), TX1(n+2)).

A control signal that is a drive pulse for controlling the transfer transistor M1 is output to the signal line TX1 from the vertical scanning circuit 20. A control signal that is a drive pulse for controlling the transfer transistor M2 is output to the signal line TX2 from the vertical scanning circuit 20. A control signal that is a drive pulse for controlling the reset transistor M3 is output to the signal line RES from the vertical scanning circuit 20. A control signal that is a drive pulse for controlling the select transistor M5 is output to the signal line SEL from the vertical scanning circuit 20. A control signal that is a drive pulse for controlling the overflow transistor M6 is output to the signal line OFG from the vertical scanning circuit 20. When each transistor is formed of an n-channel transistor, the corresponding transistor is turned on when supplied with a high-level (hereafter, denoted as "Hi-level") control signal from the vertical scanning circuit 20. Further, the corresponding transistor is turned off when supplied with a low-level (hereafter, denoted as "Lo-level") control signal from the vertical scanning circuit 20.

The vertical output line 16 arranged on each column of the pixel region 10 is connected to the sources of the select transistors M5 of the pixels 12 aligned in the column direction, respectively, and forms a signal line common to these pixels 12. Note that the select transistor M5 of the pixel 12 may be omitted. In this case, the vertical output line 16 is connected to the sources of the source follower transistors M4.

The pixel array of the circuit configuration illustrated in FIG. 2 can be implemented by a plan layout illustrated in FIG. 3, for example. A region surrounded by a dotted line in FIG. 3 (hereafter, referred to as a "unit pixel region") substantially corresponds to one pixel 12. With the unit pixel region being repeatedly aligned in the row direction and the column direction, the pixel array of the pixel region 10 is formed.

A substantial U-shape active region 104 is defined by an element isolation insulating region 102 within each unit pixel region. A gate electrode of each transistor is arranged above the active region 104. In FIG. 3, the gate electrode TX1 is the gate electrode of the transfer transistor M1, the gate electrode TX2 is the gate electrode of the transfer transistor M2, and the gate electrode RES is the gate electrode of the reset transistor M3. Further, the gate electrode SFG is the gate electrode of the source follower transistor M4, the gate electrode SEL is the gate electrode of the select transistor M5, and the gate electrode OFG is the gate electrode of the overflow transistor M6.

In FIG. 3, the photoelectric converter PD is arranged in the active region 104 located between the gate electrode TX1 and the gate electrode OFG. The holding portion MEM is arranged in the active region 104 located between the gate electrode TX1 and the gate electrode TX2. The floating diffusion FD is arranged in the active region 104 located between the gate electrode TX2 and the gate electrode RES. The active region 104 of the pixel 12 adjacent to the row direction (X-direction) is connected between the photoelectric converter PD and the connection part to the power supply voltage line VDD (the drain region of the reset transistor M3 and the source follower transistor M4). The gate electrode OFG of the overflow transistor M6 is arranged above the connection part. A light shielding layer 130 is provided above the holding portion MEM.

FIG. 4 is a schematic cross-sectional view taken along a line A-A' of FIG. 3. The conductivity type of each semiconductor region will be described assuming here a case where signal charges generated by the photoelectric converter PD are electrons. When signal charges are electrons, each transistor of the pixel 12 may be formed of an n-channel transistor. Note that signal charges generated by the photoelectric converter PD may be holes. In this case, each semiconductor region is of the opposite conductivity type, and each transistor of the pixel 12 may be formed of a p-channel transistor.

The photoelectric converter PD includes a p-type semiconductor region 106 provided in the surface of a semiconductor substrate 100, an n-type semiconductor region 108 provided in contact with the bottom of the p-type semiconductor region 106, and an n-type semiconductor region 110 provided in contact with the bottom of the n-type semiconductor region 108. The n-type semiconductor region 108 functions as an accumulation layer that accumulates electrons, which are signal charges, of pairs of electron and hole generated by an incident light. The p-type semiconductor region 106 is provided in the surface of the semiconductor substrate 100 and forms a p-n junction with the n-type semiconductor region 108. That is, the photoelectric converter PD has the buried diode structure configured to suppress interface noise by the p-type semiconductor region 106 that functions as a surface protection layer. The n-type semiconductor region 110 is an n-type region having a lower concentration than the n-type semiconductor region 108 and is responsible for collecting electrons generated at a deep position in the semiconductor substrate 100. Note that a p-type semiconductor region may be arranged instead of the n-type semiconductor region 110. When a p-type semiconductor region is arranged instead of the n-type semiconductor region 110, while this is somewhat disadvantageous in collecting electrons generated at a deep position in the semiconductor substrate 100, there is no disadvantage in operation.

A p-type semiconductor region 112 that functions as a potential barrier is provided inside the semiconductor substrate 100 at a part deeper than the photoelectric converter PD. Thereby, the photoelectric converter PD is electrically isolated from an n-type semiconductor region 114 of the semiconductor substrate 100 at a deeper part. The p-type semiconductor region 112 provides an advantage of preventing unnecessary charges not caused by photoelectric conversion from being mixed to the photoelectric converter PD from the n-type semiconductor region 114. Note that, as an example, the n-type semiconductor region 114 corresponds to a portion of the n-type semiconductor substrate 100 where no impurity has been intentionally introduced by ion implantation or the like.

The holding portion MEM includes a p-type semiconductor region 116 provided on the surface of a semiconductor substrate 100 and an n-type semiconductor region 118 provided in contact with the bottom of the p-type semiconductor region 116. The n-type semiconductor region 118 functions as a holding layer that holds signal charges. The p-type semiconductor region 116 is provided on the surface of the semiconductor substrate 100 and forms a p-n junction with the n-type semiconductor region 118. That is, the holding MEM has the buried diode structure configured to suppress interface noise by the p-type semiconductor region 116 that functions as a surface protection layer in the same manner as the photoelectric converter PD. The concentration of n-type impurity in the n-type semiconductor region 118 is higher than the concentration of n-type impurity in the n-type semiconductor region 108 of the photoelectric converter PD.

A p-type semiconductor region 120 that functions as a depletion suppression portion is provided in contact with the n-type semiconductor region 118 at a part deeper than the holding portion MEM. The p-type semiconductor region 120 provides an advantage of being able to reduce a voltage applied to the gate electrode TX2 of the transfer transistor M2 when reading out signal charges from the holding portion MEM to the floating diffusion FD with the n-type semiconductor region 118 being a fully depleted state. A higher concentration of the p-type semiconductor region 120 enables charge transfer at a lower voltage.

The holding portion MEM and the p-type semiconductor region 120 are provided inside the p-well 122. While the p-well 122 is represented by a plurality of p-type semiconductor regions 122a, 122b, 122c, 122d, and 122e for visualizing that the p-well 122 is formed by multiple times of impurity ion implantation in FIG. 4, a single p-type semiconductor region is formed as a whole in terms of function. With the impurity concentration of the p-well 122 under the p-type semiconductor region 120 being lower than that of the p-type semiconductor region 120, it is possible to effectively suppress unnecessary charges located at a deeper part of the p-type semiconductor region 120 from being mixed in the holding portion MEM. Note that it can be said that the p-type semiconductor region 112 is a part of the p-well 122. The p-well 122 is not necessarily required to be formed by multiple times of impurity implantation, and the number of times of impurity implantation performed for forming the p-well 122 is not limited to that illustrated.

An n-type semiconductor region 124 that functions as the floating diffusion FD is provided in the p-well 122 (the p-type semiconductor region 122a) spaced apart from the n-type semiconductor region 118 of the holding portion MEM. Further, an n-type semiconductor region 126 that functions as the overflow drain is provided in the p-well 122 (the p-type semiconductor region 122a) spaced apart from the n-type semiconductor region 108 of the photoelectric converter PD.

The gate electrode TX1 is provided above the semiconductor substrate 100 between the photoelectric converter PD and the holding portion MEM with a gate insulating film (not illustrated) interposed therebetween. Thereby, the transfer transistor M1 in which the gate electrode TX1 is the gate, the n-type semiconductor region 108 is the source, and the n-type semiconductor region 118 is the drain is formed. The n-type semiconductor region 108 extends under the gate electrode TX1 in order to facilitate charge transfer. That is, the n-type semiconductor region 108 and the gate electrode TX1 include an overlapping region in a plan view.

The gate electrode TX2 is provided above the semiconductor substrate 100 between the holding portion MEM and the n-type semiconductor region 124 with a gate insulating film (not illustrated) interposed therebetween. Thereby, the transfer transistor M2 in which the gate electrode TX2 is the gate, the n-type semiconductor region 118 is the source, and the n-type semiconductor region 124 is the drain is formed. The n-type semiconductor region 118 extends under the gate electrode TX1 in order to facilitate charge transfer. That is, the n-type semiconductor region 118 and the gate electrode TX1 include an overlapping region in the plan view.

The gate electrode OFG is provided above the semiconductor substrate 100 between the photoelectric converter PD and the n-type semiconductor region 126 with a gate insulating film (not illustrated) interposed therebetween. Thereby, the overflow transistor M6 in which the gate electrode OFG is the gate, the n-type semiconductor region 108 is the source, and the n-type semiconductor region 126 is the drain is formed.

The light shielding layer 130 covering the holding portion MEM is provided over the holding portion MEM. The light shielding layer 130 has a function of shielding the holding portion MEM from an incident light and preventing occurrence of unnecessary charges other than signal charges generated by the photoelectric conversion in the photoelectric converter PD. In general, a metal film that has a light-shielding effect to a visible light, such as tungsten, aluminum, or the like, is used for the light shielding layer 130. However, the material forming the light shielding layer 130 is not limited to the material described above.

When an optical image of an object enters the pixel region 10, the photoelectric converter PD of each pixel 12 converts (photoelectrically converts) the incident light into an amount of charges in accordance with the light amount thereof and accumulates the generated charges (electrons) in the n-type semiconductor region 108.

When turned on, the transfer transistor M1 transfers charges (signal charges) accumulated in the photoelectric converter PD to the n-type semiconductor region 118 of the holding portion MEM. At this time, the vertical scanning circuit 20 functions as a transfer control unit that controls the transfer transistor M1. The holding portion MEM holds charges generated by the photoelectric converter PD in a location different from the photoelectric converter PD.

When pixel signals are read out from the pixels 12 on a plurality of rows, in the CMOS image sensor without the holding portion MEM, transfer transistors of the pixels on respective rows are driven sequentially on a row-by-row basis. In contrast, in the imaging device of the present embodiment having the holding portion MEM, it is possible to perform the operation of transferring signal charges of the photoelectric converters PD of the pixels 12 simultaneously on all the rows to the holding portions MEM, that is, the operation of all-pixel simultaneous transfer. After the all-pixel simultaneous transfer, the photoelectric converter PD is in an empty state, that is, the initial state and is ready to start the next exposure period. That is, in the imaging device according to the present embodiment, the operation to control the start of exposure and the completion of exposure at the same time on all the pixels, that is, the all-pixel simultaneous electronic shutter operation (global electronic shutter operation) can be performed.

When turned on, the transfer transistor M2 transfers signal charges held in the holding portion MEM to the floating diffusion FD (n-type semiconductor region 124). The transfer of signal charges from the holding portion MEM to the floating diffusion FD is performed by driving the transfer transistors M2 of the pixels 12 on respective rows sequentially on a row-by-row basis. The floating diffusion FD holds signal charges transferred from the holding portion MEM and, with the charge-to-voltage conversion by the capacitor component thereof, becomes a voltage in accordance with the amount of the transferred signal charges.

The source follower transistor M4 is configured such that the voltage VDD is supplied to the drain and the bias current is supplied to the source via the select transistor M5 and forms an amplifier unit (source follower circuit) whose gate is the input node. Thereby, the source follower transistor M4 outputs a pixel signal VOUT based on the voltage of the floating diffusion FD to the vertical output line 16 via the select transistor M5. By sequentially driving the transfer transistors M2 of the pixels 12 on respective rows, it is possible to read out pixel signals from all the pixels 12 of the pixel region 10. Note that, in FIG. 2, corresponding column numbers are appended to the pixel signals VOUT (VOUT (m), VOUT(m+1), VOUT(m+2)), respectively.

When turned on, the select transistor M5 connects the source follower transistor M4 to the vertical output line 16. That is, when turned on, the select transistor M5 selects the pixel 12 from which a pixel signal is output.

When turned on, the reset transistor M3 resets the floating diffusion FD to a predetermined voltage in accordance with the voltage VDD. Further, when the reset transistor M3 and the transfer transistor M2 are turned on at the same time, the holding portion MEM can be reset to a voltage in accordance with the voltage VDD.

When turned on, the overflow transistor M6 drains charges of photoelectric converter PD to the overflow drain OFD and resets the photoelectric converter PD to a predetermined voltage in accordance with the voltage VOFD of the overflow drain OFD. By enabling the reset of the photoelectric converter PD performed by the overflow transistor M6, controllability of a charge accumulation period in the photoelectric converter PD is improved. Note that the pixel 12 is not necessarily required to have the overflow transistor M6.

FIG. 5A to FIG. 5D are potential diagrams for signal charges taken along a line A-A' of FIG. 3. In FIG. 5A to FIG. 5D, the energy of electrons to be signal charges is focused on and represented in which the positive direction of an electric potential is defined as the downward direction and the negative direction of an electric potential is defined as the upward direction.

Figure 5A:
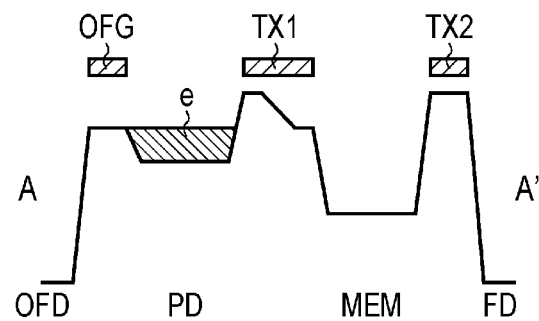
FIG. 5A, FIG. 5B, FIG. 5C, and FIG. 5D are potential diagrams at charge transfer in the imaging device according to the first embodiment of the present invention.
Figure 5B:
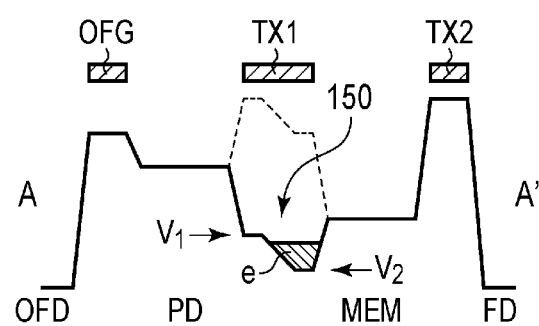
Figure 5C:
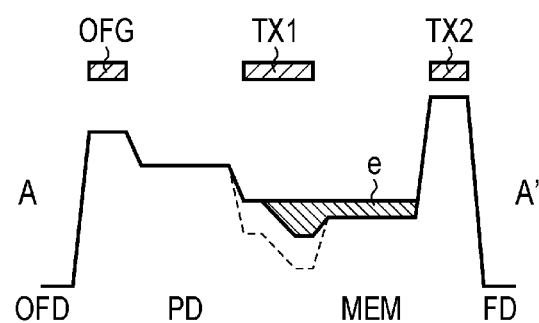
Figure 5D:
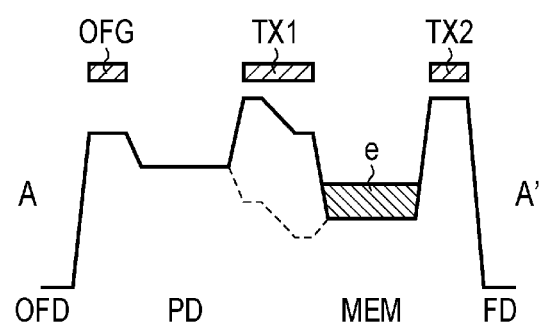

FIG. 5A is a potential diagram of a state where charges e are accumulated in the photoelectric converter PD and the transfer transistor M1 is in an off-state. FIG. 5B is a potential diagram of a state where the transfer transistor M1 is turned on from the state of FIG. 5A. FIG. 5C is a potential diagram illustrating a transient state in a transition process of the transfer transistor M1 to an off-state from the state of FIG. 5B. FIG. 5D is a potential diagram in a state where the transfer transistor M1 is turned off from the state of FIG. 5C and the transfer of charges e to the holding portion MEM is completed.

In the state where the transfer transistor M1 is in an off-state, as illustrated in FIG. 5A, a potential barrier against electrons is formed between the photoelectric converter PD and the holding portion MEM. This potential barrier is higher in the photoelectric converter PD side for the reasons that the n-type impurity concentration of the n-type semiconductor region 118 is higher than the n-type impurity concentration of the n-type semiconductor region 108 and that the n-type semiconductor regions 108 and 118 and the gate electrode TX1 are partially overlapped with each other. That is, an electric potential difference is formed so as to form a shoulder part on the photoelectric converter PD side in a portion from the photoelectric converter PD side to the holding portion MEM side below the gate electrode TX1 of the transfer transistor M1. Therefore, the charges e generated in the photoelectric converter PD in a period when the transfer transistor M1 is in an off-state are accumulated in the photoelectric converter PD without being transferred to the holding portion MEM, as illustrated in FIG. 5A.

When the transfer transistor M1 is driven from an off-state to an on-state, the potential below the gate electrode TX1 increases (the potential barrier against electrons decreases) while the above-described electric potential difference below the gate electrode TX1 is maintained, as illustrated in FIG. 5A and FIG. 5B. Then, a potential well 150 is formed so as to form a valley part on the holding portion MEM side in a portion from the photoelectric converter PD side to the holding portion MEM side below the gate electrode TX1.

When the potential barrier below the gate electrode TX1 decreases, the charges e accumulated in the photoelectric converter PD move to the holding portion MEM side. Since the electric potential difference between the photoelectric converter PD and the holding portion MEM at this time is small, however, many charges e are temporarily held in the potential well 150 below the gate electrode TX1 that has been forced to be lowered by the transfer transistor M1 being turned on.

The charge amount $Q_{GS}$ that can be held in the potential well 150 is expressed by Equation (1) below, where the electric potential at the shoulder part on the photoelectric converter PD side is denoted as $V_1$, the electric potential of the bottom of the valley part on the holding portion MEM side is denoted as $V_2$, and the capacitance of the potential well 150 is denoted as $C_{TX}$.

$$Q_{GS} = C_{TX} \times (V_2 - V_1) \quad (1)$$

When the transfer transistor M1 is driven from an on-state to an off-state, the potential below the gate electrode TX1 decreases and charges held in the potential well 150 are transferred to the holding portion MEM, as illustrated in FIG. 5B to FIG. 5D. When the transfer transistor M1 is turned off, transfer of charges from the potential well 150 to the holding portion MEM is completed as illustrated in FIG. 5D.

FIG. 6A to FIG. 6D are potential diagrams for signal charges along a line A-A' of FIG. 3 when the difference in the n-type impurity concentration between the n-type semiconductor region 118 forming the holding portion MEM and the n-type semiconductor region 108 forming the photoelectric converter PD is smaller than that of the case of FIG. 5A to FIG. 5D.

Figure 6A:
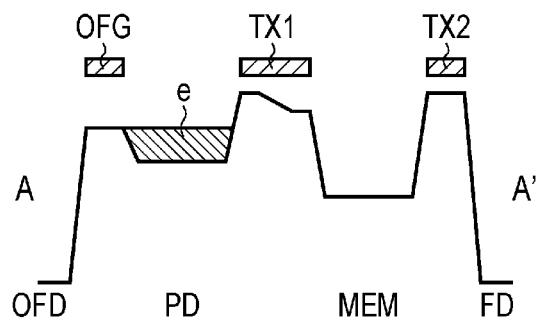
FIG. 6A, FIG. 6B, FIG. 6C, and FIG. 6D are potential diagrams at charge transfer in an imaging device according to a reference example.
Figure 6B:
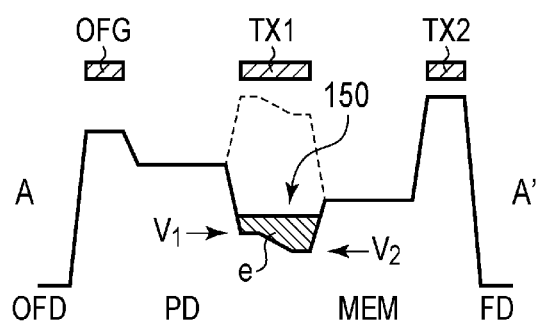
Figure 6C:
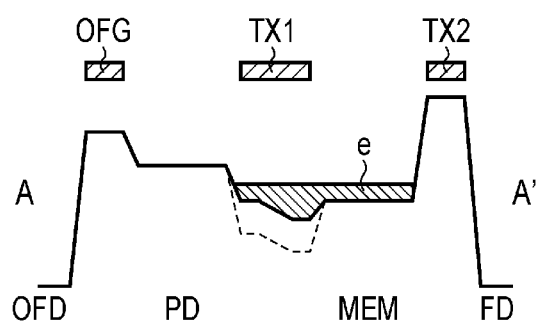
Figure 6D:
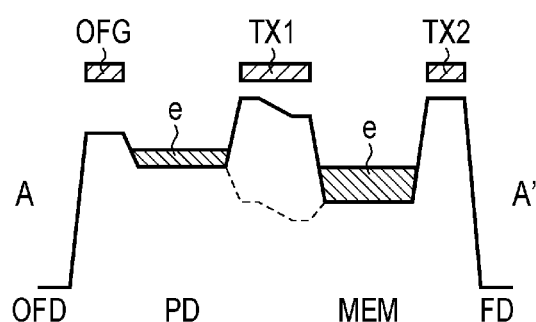

FIG. 6A is a potential diagram of a state where charges e are accumulated in the photoelectric converter PD and the transfer transistor M1 is in an off-state. FIG. 6B is a potential diagram of a state where the transfer transistor M1 is turned on from the state of FIG. 6A. FIG. 6C is a potential diagram illustrating a transient state in a transition process of the transfer transistor M1 to an off-state from the state of FIG. 6B. FIG. 6D is a potential diagram in a state where the transfer transistor M1 is turned off from the state of FIG. 6C and the transfer of charges e to the holding portion MEM is completed.

When the difference in the n-type impurity concentration between the n-type semiconductor region 118 and the n-type semiconductor region 108 is small, the electric potential difference formed in a portion from the photoelectric converter PD side to the holding portion MEM side below the gate electrode TX1 of the transfer transistor M1 becomes smaller, as illustrated in FIG. 6A. Thus, the electric potential $V_2$ at the bottom of the valley part formed in a portion from the photoelectric converter PD side to the holding portion MEM side below the gate electrode TX1 when the transfer transistor M1 is in an on-state decreases as illustrated in FIG. 6B. As a result, the charge amount $Q_{GS}$ that can be held in the potential well 150 will decrease.

When the charge amount $Q_{GS}$ that can be held in the potential well 150 is smaller than a charge amount $Q_{PD}$ generated by the photoelectric converter PD, all the charges e transferred from the photoelectric converter PD cannot be held in the potential well 150. The excessive charges e that cannot be held in the potential well 150 will stay at an electric potential lower than the electric potential of the shoulder part on the photoelectric converter PD side, as illustrated in FIG. 6B.

When the transfer transistor M1 is driven from an on-state to an off-state in this state, the electric potential difference between the potential barrier on the photoelectric converter PD side and the holding portion MEM is removed in the transient state of a process in which the transfer transistor M1 transitions from an on-state to an off-state, as illustrated in FIG. 6C. As a result, in a process in which the transfer transistor M1 transitions to an off-state, a reverse flow of charges to the photoelectric converter PD will occur as illustrated in FIG. 6D. Occurrence of a reverse flow of charges results in a decrease of a total amount of signal charges transferred to the holding portion MEM, which causes deterioration of the linear relationship between the incident light amount and the pixel signal output, namely, so-called linearity characteristics.

Further, when a part of the charges e which cannot be held in the potential well 150 overflows to the charge holding portion as illustrated in FIG. 2 of International Publication No. WO2011/043432, for example, the electric potential of the charge holding portion decreases due to the overflowing charges, and the electric potential difference from the potential barrier on the photoelectric converter side is reduced. Further, when the amount of signal charges generated by the photoelectric converter is large, there is no electric potential difference from the potential barrier forming the shoulder part on the photoelectric converter side, and a reverse flow of charges to the photoelectric converter side will occur in a transition process of the transfer transistor from an on-state to an off-state.

Therefore, in terms of suppression of a reverse flow of charges to the photoelectric converter side, it is desirable that a saturation charge amount $Q_{PD\_SAT}$ of the photoelectric converter PD and the charge amount $Q_{GS}$ that can be held in the potential well 150 satisfy the relationship of Equation (2) below.

$$Q_{GS} > Q_{PD\_SAT} \tag{2}$$

With such a configuration, all the charges temporarily held in the potential well 150 can be transferred to the holding portion MEM without returning to the photoelectric converter PD in a transition process of the transfer transistor M1 to an off-state, as illustrated by using FIG. 5C.

Further, in order that all the signal charges transferred from the photoelectric converter PD are held in the holding portion MEM, it is required that a saturation charge amount $Q_{MEM\_SAT}$ of the holding portion MEM be greater than or equal to the maximum charge amount $Q_{GS}$ that can be held in the potential well 150.

To summarize the above, it is desirable to configure the saturation charge amounts $Q_{PD\_SAT}$ and $Q_{MEM\_SAT}$ and the charge amount $Q_{GS}$ to satisfy the relationship of Equation (3) below in order to transfer signal charges generated by the photoelectric converter PD to the holding portion MEM without a reverse flow of charges.

$$Q_{PD\_SAT} < Q_{GS} \leq Q_{MEM\_SAT} \tag{3}$$

In the imaging device according to the present embodiment, the n-type impurity concentration of the n-type semiconductor region 118 forming the holding portion MEM is higher than the n-type impurity concentration of the n-type semiconductor region 108 forming the photoelectric converter PD. Further, the n-type semiconductor region 108 and the gate electrode TX1 are arranged so as to include an overlapping region in the plan view, and the n-type semiconductor region 118 and the gate electrode TX1 are arranged so as to include an overlapping region in the plan view. With such a configuration, the potential of the holding portion MEM to signal charges can be deeper than the potential of the photoelectric converter PD, and an electric potential difference can be provided in a portion from the photoelectric converter PD side to the holding portion MEM side below the gate electrode TX1. Further, the value of the saturation charge amount $Q_{PD\_SAT}$ or $Q_{MEM\_SAT}$ or the maximum charge amount $Q_{GS}$ that can be held in the potential well 150 can be adjusted as appropriate by changing the n-type impurity concentration of the n-type semiconductor regions 108 and 118, the area of the photoelectric converter PD and the holding portion MEM, or the like.

As discussed above, according to the present embodiment, in the imaging device having a global electronic shutter function, it is possible to effectively suppress a reverse flow of charges when signal charges are transferred from the photoelectric converter to the charge holding portion and acquire a high quality image having good linearity characteristics.

Second Embodiment

Figure 7:
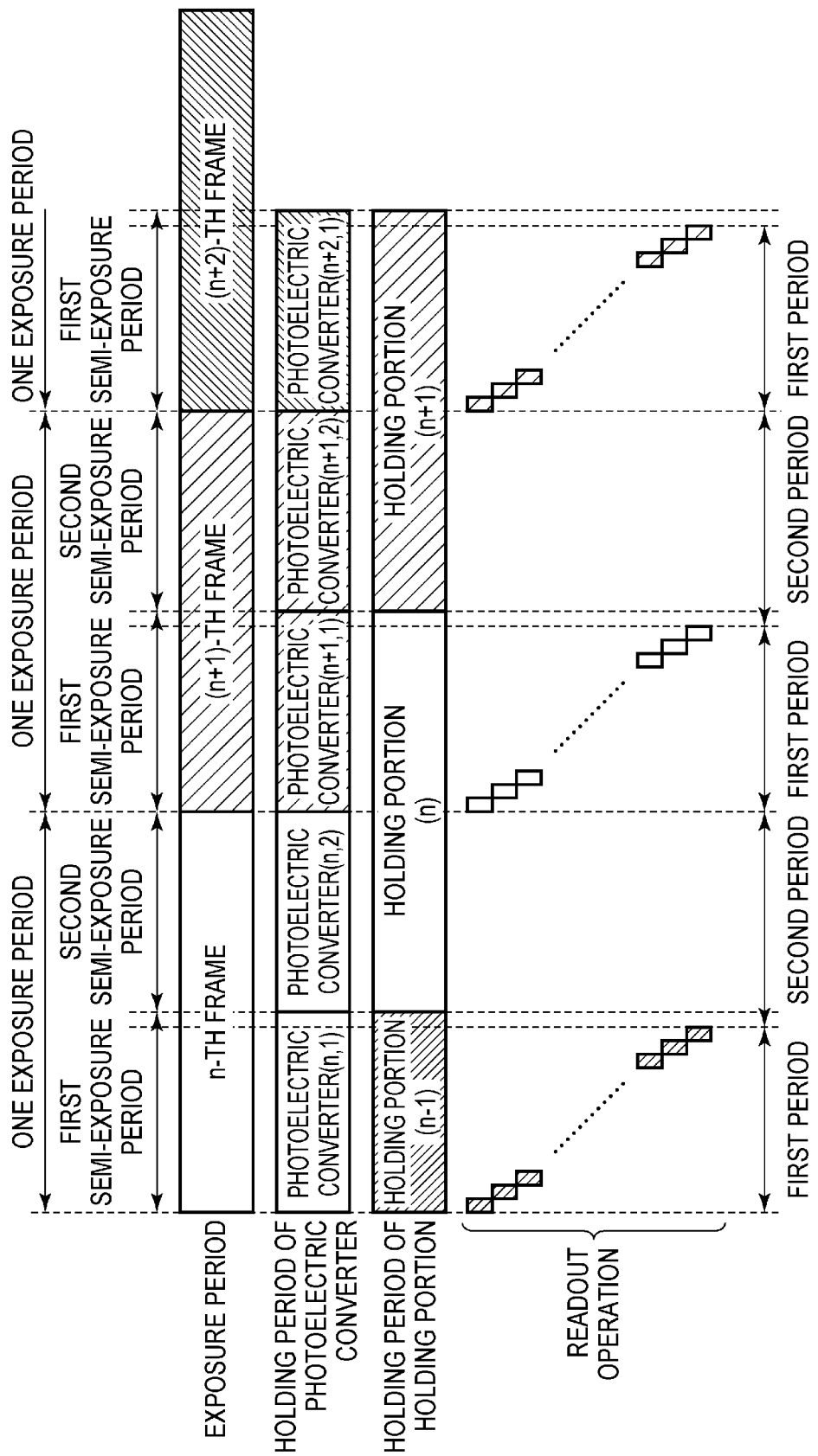
FIG. 7 is a schematic diagram illustrating a method of driving an imaging device according to a second embodiment of the present invention.

An imaging device according to a second embodiment of the present invention will be described with reference to FIG. 7 to FIG. 8E. The same components as those of the imaging device according to the first embodiment are labeled with the same references, and the description thereof will be omitted or simplified. FIG. 7 is a schematic diagram illustrating a drive method of the imaging device according to the present embodiment. FIG. 8A to FIG. 8E are potential diagrams at charge transfer according to the present embodiment.

Charge transfer from the photoelectric converter PD to the holding portion MEM is not necessarily performed by turning on the transfer transistor M1 at once and can be performed for divided multiple times by turning on the transfer transistor M1 for multiple times. In the present embodiment, a configuration of the imaging device that is suitable when transfer of charges from the photoelectric converter PD to the holding portion MEM are performed for divided multiple times will be described. The basic configuration of the imaging device according to the present embodiment is the same as that of the imaging device according to the first embodiment described by using FIG. 1 to FIG. 4.

FIG. 7 schematically illustrates a drive example when signal charges generated by the photoelectric converter PD are transferred to the holding portion MEM by two times of transfer operations during one exposure period. FIG. 7 illustrates an imaging operation in the n-th frame and an imaging operation in the (n+1)-th frame. Further, FIG. 7 illustrates a part of operation in the (n−1)-th frame and the (n+2)-th frame for better understanding of the relationship with preceding and subsequent operations. Further, FIG. 7 illustrates an exposure period and a semi-exposure period, a period in which the photoelectric converter PD holds charges, a period in which the holding portion MEM holds charges, and a readout operation in each frame. In FIG. 7, the operation in the n-th frame is represented by a white block, and the operation in the (n+1)-th frame is represented by a hatched block.

A single exposure period that is an accumulation period of charges to the photoelectric converter PD for forming one image in each frame includes a first semi-exposure period and a second semi-exposure period. Charge transfer from the photoelectric converter PD to the holding portion MEM is performed two times in total at a timing of the end of the first semi-exposure period and a timing of the end of the second semi-exposure period. When the second semi-exposure period ends, charges generated by the photoelectric converter PD in the total period of the first semi-exposure period and the second exposure period, that is, in one exposure period have been held in the holding portion MEM. Charge transfer from the photoelectric converter PD to the holding portion MEM is performed at the same time for all the pixels 12.

The readout operation of signal charges held in the holding portion MEM is performed sequentially on a row-by-row basis in the first period of the next frame. For example, the readout operation of a signal based on signal charges accumulated during the exposure period of the n-th frame is performed during the first period in the (n+1)-th frame. By the second transfer operation performed at the timing of the end of the second semi-exposure period, all the signal charges held in the photoelectric converter PD have been transferred to the holding portion MEM. Therefore, after the completion of the second transfer operation, the first semi-exposure period for the next frame can be immediately started in the photoelectric converter PD in parallel to the readout operation of signal charges held in the holding portion MEM. Therefore, a period in which information is missed can be substantially eliminated, and the image quality can be improved.

Charges held in the holding portion MEM are transferred to the floating diffusion FD by a readout operation, and the holding portion MEM returns to the initial state. Therefore, in the second period after the first period in which a readout operation is performed, holding of charges used for the next frame is enabled in the holding portion MEM. That is, the first transfer operation performed at the timing of the completion of the first semi-exposure period can be performed in the second period after the completion of the first period.

As discussed above, charge transfer from the photoelectric converter PD to the holding portion MEM is configured to be performed for divided multiple times, and thereby the saturation charge amount of the pixel 12 can be increased over the saturation charge amount $Q_{PD\_SAT}$ of the photoelectric converter PD. The saturation charge amount of the pixel 12 is the maximum value of the charge amount that can be handled as a signal out of charges generated during one exposure period. Typically, the saturation charge amount of the pixel 12 is the saturation charge amount $Q_{MEM\_SAT}$ of the holding portion MEM. Here, the saturation charge amount $Q_{PD\_SAT}$ of the photoelectric converter PD is the maximum value of the charge amount that can be accumulated in the photoelectric converter PD, and the saturation charge amount $Q_{MEM\_SAT}$ of the holding portion MEM is the maximum value of the charge amount that can be held in the holding portion MEM. When the length of the first semi-exposure period is the same as the length of the second semi-exposure period, the saturation charge amount $Q_{MEM\_SAT}$ is twice the saturation charge amount $Q_{PD\_SAT}$.

Next, in the driving illustrated in FIG. 7, charge transfer from the photoelectric converter PD to the holding portion MEM performed at the timing of the end of the second period will be described in more detail by using FIG. 8A to FIG. 8E. FIG. 8A to FIG. 8E are potential diagrams for signal charges taken along a line A-A' of FIG. 3. In FIG. 8A to FIG. 8E, the energy of electrons is focused on and represented in which the positive direction of an electric potential is defined as the downward direction and the negative direction of an electric potential is defined as the upward direction.

Figure 8A:
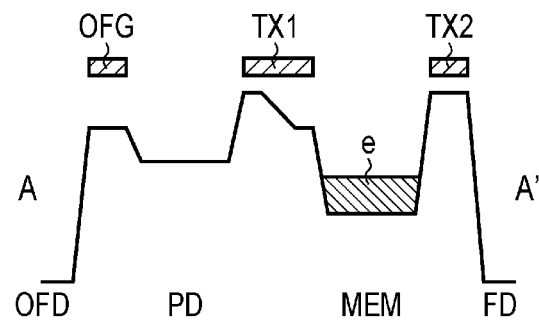
FIG. 8A, FIG. 8B, FIG. 8C, FIG. 8D, and FIG. 8E are potential diagrams at charge transfer according to the second embodiment of the present invention.
Figure 8B:
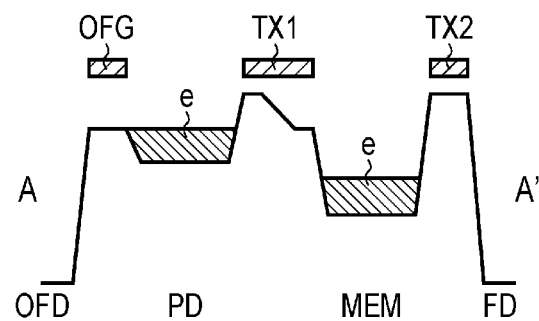
Figure 8C:
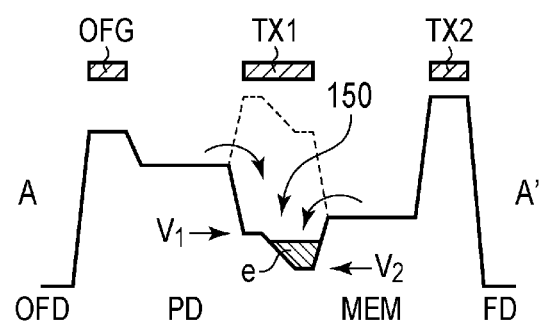
Figure 8D:
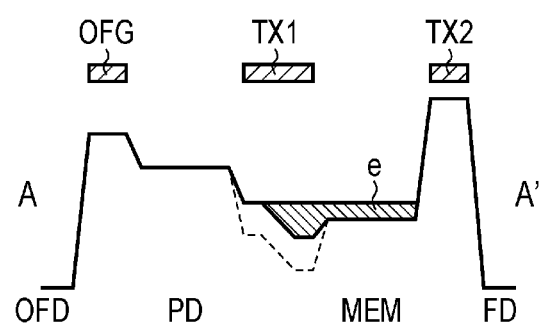
Figure 8E:
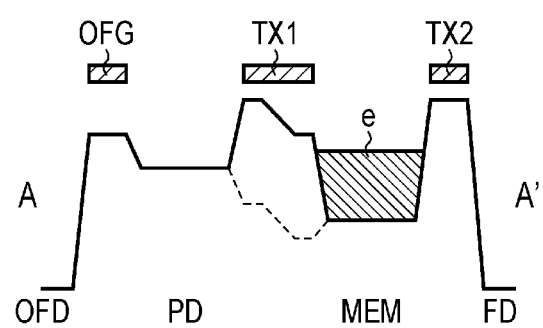

FIG. 8A is a potential diagram of a state immediately after the completion of the first transfer operation and where charges generated during the first semi-exposure period are held in the holding portion MEM. FIG. 8B is a potential diagram of a state immediately before the second transfer operation and where charges generated during the first semi-exposure period are held in the holding portion MEM and charges generated during the second semi-exposure period are held in the photoelectric converter PD. FIG. 8C is a potential diagram of a state where the transfer transistor M1 is turned on from the state of FIG. 8B. FIG. 8D is a potential diagram illustrating a transient state in a transition process of the transfer transistor M1 to an off-state from the state of FIG. 8C. FIG. 8E is a potential diagram in a state where the transfer transistor M1 is turned off from the state of FIG. 8D and the transfer of charges e to the holding portion MEM is completed.

As illustrated in FIG. 8C, when the transfer transistor M1 is turned on in the second transfer operation, the electric potential of the potential well 150 below the gate electrode TX1 becomes higher than the photoelectric converter PD and the holding portion MEM. Thereby, charges generated during the first semi-exposure period and held in the holding portion MEM and charges generated during the second semi-exposure period and accumulated in the photoelectric converter PD are temporarily held in the potential well 150.

At this time, the amount of charges held in the potential well 150 is twice the saturation charge amount $Q_{PD\_SAT}$ of the photoelectric converter PD at the maximum. To suppress a reverse flow of charges in a process in which the transfer transistor M1 transitions from an on-state to an off-state, it is desirable that the saturation charge amount $Q_{PD\_SAT}$ of the photoelectric converter PD and the charge amount $Q_{GS}$ that can be held in the potential well 150 satisfy the relationship of Equation (4) below.

$$Q_{GS} \geq 2 \times Q_{PD\_SAT} \tag{4}$$

Further, Equation (3) is rewritten as Equation (5) below, where the number of times of transfer of signal charges from the photoelectric converter PD to the holding portion MEM is denoted as N.

$$Q_{GS} \geq N \times Q_{PD\_SAT} \tag{5}$$

To summarize the above, it is desirable to configure the saturation charge amounts $Q_{PD\_SAT}$ and $Q_{MEM\_SAT}$ and the charge amount $Q_{GS}$ to satisfy the relationship of Equation (6) below in order to transfer signal charges generated by the photoelectric converter PD to the holding portion MEM without a reverse flow of charges.

$$Q_{PD\_SAT} \times N < Q_{GS} \leq Q_{MEM\_SAT} \tag{6}$$

Note that Equation (3) illustrated in the first embodiment corresponds to the case where the number of times N of transfer of signal charge from the photoelectric converter PD to the holding portion MEM is one. The term $Q_{PD\_SAT} \times N$ denotes the maximum charge amount $Q_{PD}$ generated in the photoelectric converter PD during one exposure period.

In the imaging device according to the present embodiment, the n-type impurity concentration of the n-type semiconductor region 118 forming the holding portion MEM is higher than the n-type impurity concentration of the n-type semiconductor region 108 forming the photoelectric converter PD. Further, the n-type semiconductor region 108 and the gate electrode TX1 are arranged so as to include an overlapping region in a plan view, and the n-type semiconductor region 118 and the gate electrode TX1 are arranged so as to include an overlapping region in the plan view. With such a configuration, the potential of the holding portion MEM to signal charges can be deeper than the potential of the photoelectric converter PD, and an electric potential difference can be provided in a portion from the photoelectric converter PD side to the holding portion MEM side below the gate electrode TX1. Further, the value of the saturation charge amount $Q_{PD\_SAT}$ or $Q_{MEM\_SAT}$ or the maximum charge amount $Q_{GS}$ that can be held in the potential well 150 can be adjusted as appropriate by changing the n-type impurity concentration of the n-type semiconductor regions 108 and 118, the area of the photoelectric converter PD and the holding portion MEM, or the like.

As discussed above, according to the present embodiment, in the imaging device having a global electronic shutter function, it is possible to effectively suppress a reverse flow of charges when signal charges are transferred from the photoelectric converter to the charge holding portion and acquire a high quality image having good linearity characteristics.

Third Embodiment

An imaging device according to a third embodiment of the present invention will be described with reference to FIG. 9 to FIG. 11D. The same components as those of the imaging device according to the first embodiment are labeled with the same references, and the description thereof will be omitted or simplified.

Figure 9:
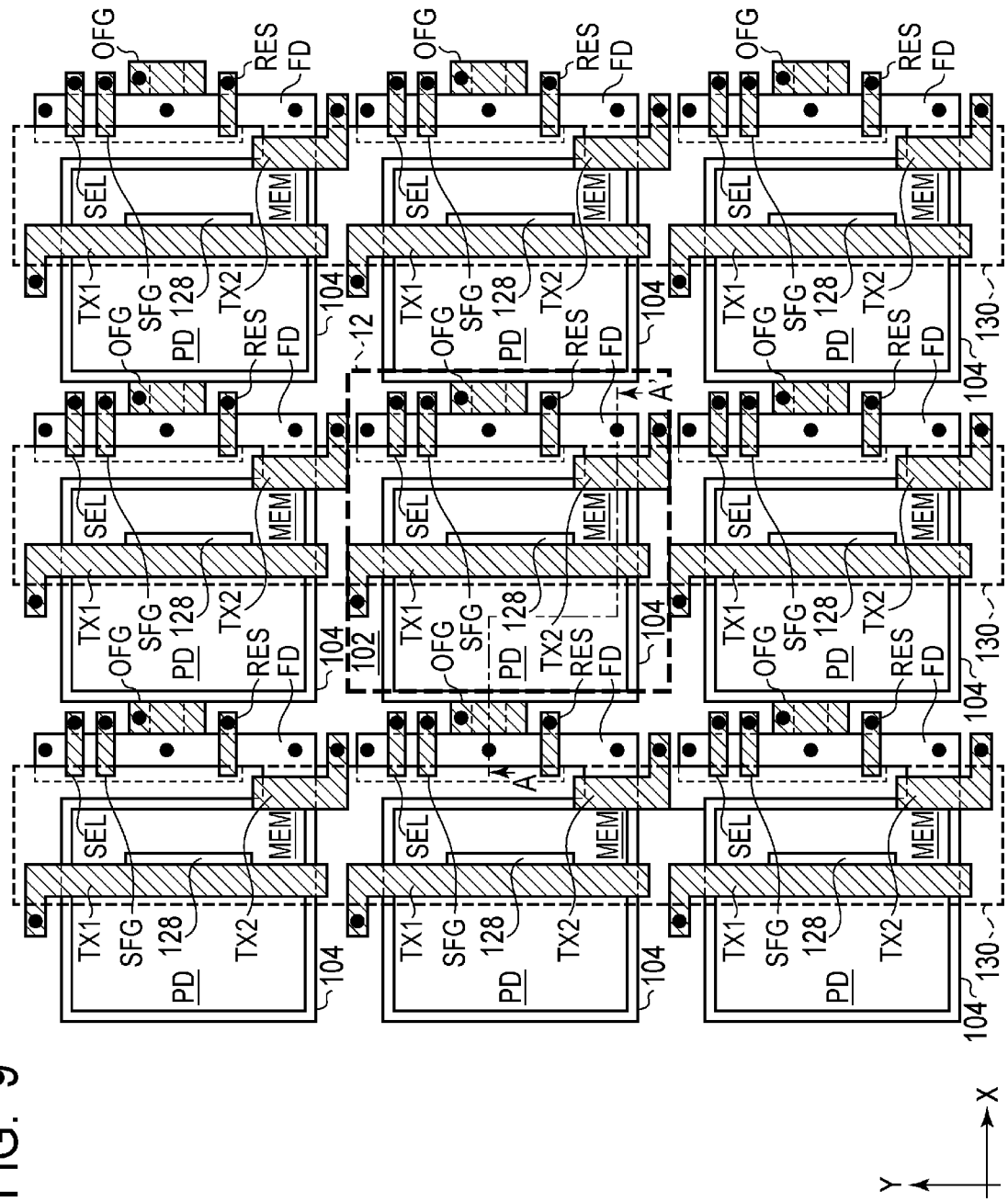
FIG. 9 is a plan view illustrating the structure of a pixel of an imaging device according to a third embodiment of the present invention.
Figure 10:
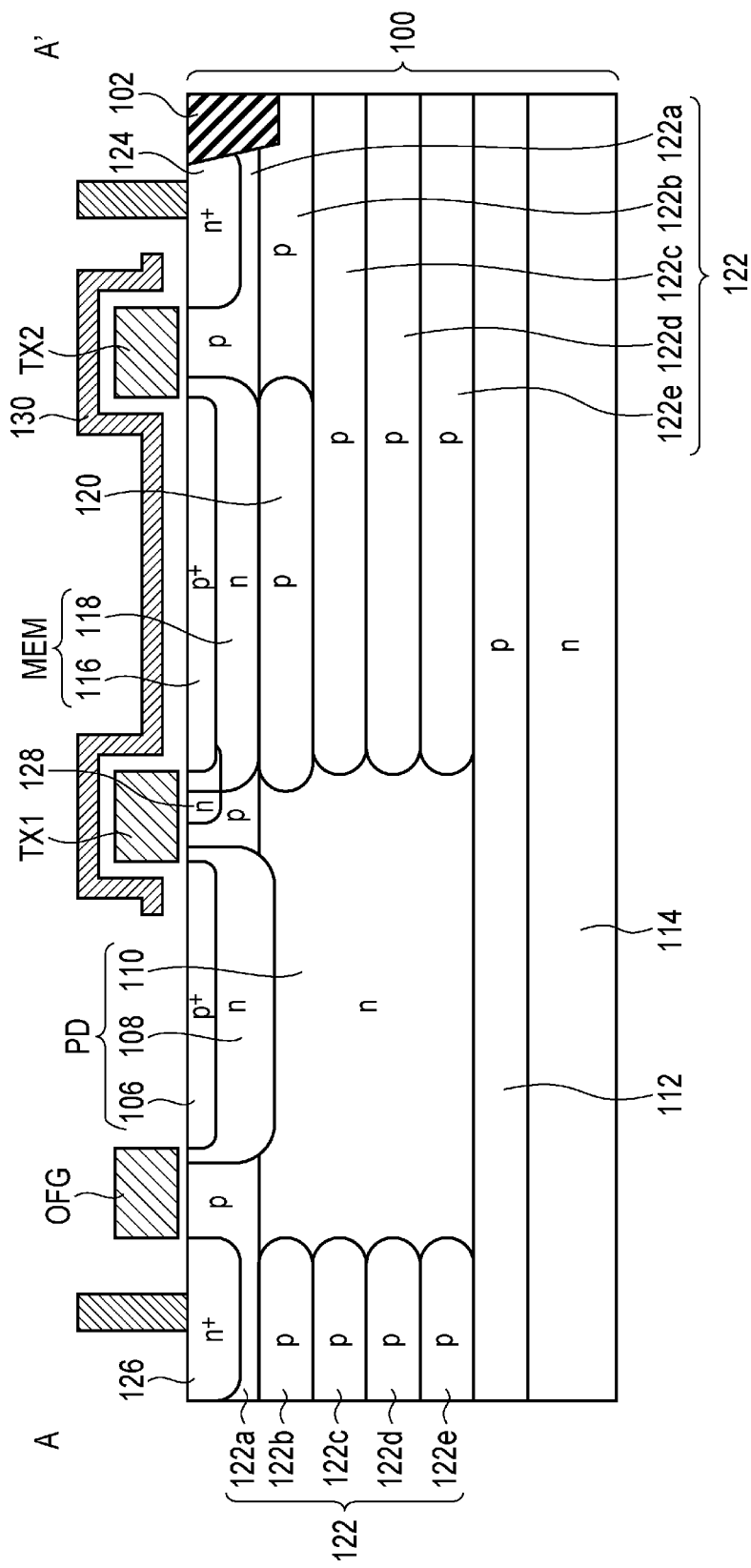
FIG. 10 is a schematic cross-sectional view illustrating the structure of the pixel of the imaging device according to the third embodiment of the present invention.

FIG. 9 is a plan view illustrating the structure of a pixel of the imaging device according to the present embodiment. FIG. 10 is a schematic cross-sectional view illustrating the structure of a pixel of the imaging device according to the present embodiment. FIG. 11A to FIG. 11D are potential diagrams at charge transfer according to the present embodiment.

As illustrated in FIG. 9 and FIG. 10, the imaging device according to the present embodiment is the same as the imaging device according to the first embodiment except that an n-type semiconductor region 128 is further provided at the end on the photoelectric converter PD side of the p-type semiconductor region 116 of the holding portion MEM.

The end of a region where the n-type semiconductor region 128 and the gate electrode TX1 overlap each other in a plan view is located closer to the photoelectric converter PD side than the end of a region where the n-type semiconductor region 118 and the gate electrode TX1 overlap each other in the plan view. Further, with the n-type semiconductor region 128 being provided, the n-type impurity concentration on the holding portion MEM side below the gate electrode TX1 is higher than the case of the first embodiment.

Figure 11A:
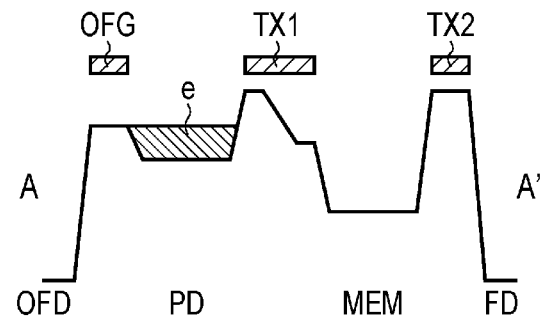
FIG. 11A, FIG. 11B, FIG. 11C, and FIG. 11D are potential diagrams at charge transfer according to the third embodiment of the present invention.
Figure 11B:
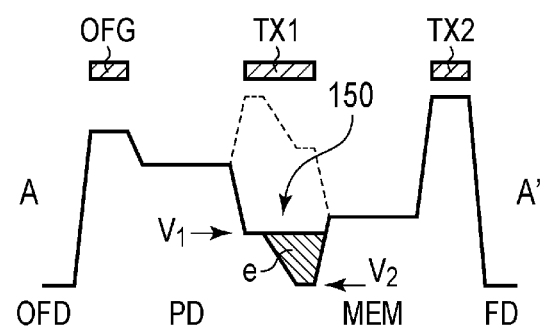
Figure 11C:
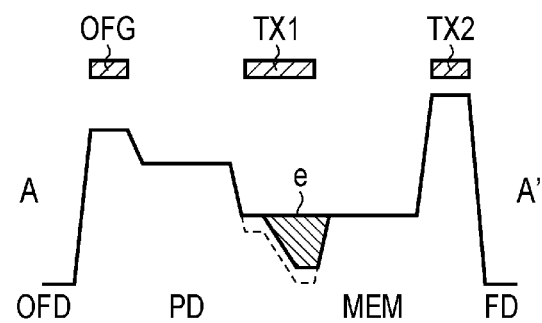
Figure 11D:
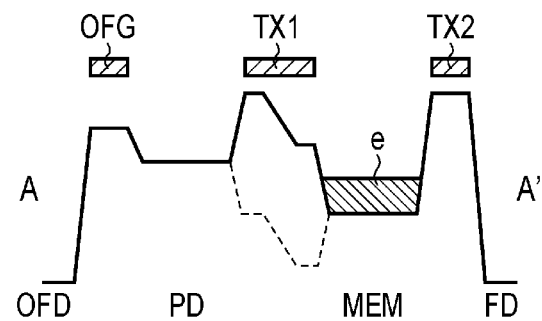

FIG. 11A to FIG. 11D are potential diagrams for signal charges taken along a line A-A' of FIG. 9. FIG. 11A is a potential diagram of a state where charges e are accumulated in the photoelectric converter PD and the transfer transistor M1 is in an off-state. FIG. 11B is a potential diagram of a state where the transfer transistor M1 is turned on from the state of FIG. 11A. FIG. 11C is a potential diagram illustrating a transient state in a transition process of the transfer transistor M1 to an off-state from the state of FIG. 11B. FIG. 11D is a potential diagram in a state where the transfer transistor M1 is turned off from the state of FIG. 11C and the transfer of charges e to the holding portion MEM is completed.

In the present embodiment, due to the n-type semiconductor region 128 being further provided, the electric potential difference formed in a portion from the photoelectric converter PD side to the holding portion MEM side below the gate electrode TX1 is larger than the case of the first embodiment, as illustrated in FIG. 11A. Further, the electric potential $V_2$ at the bottom of the valley part formed in a portion from the photoelectric converter PD side below the gate electrode TX1 to the holding portion MEM side when the transfer transistor M1 is in an on-state is larger than the case of the first embodiment, as illustrated in FIG. 11B. This can increase the charge amount $Q_{GS}$ that can be held in the potential well 150 and further suppress a reverse flow of charges in a process in which the transfer transistor M1 transitions from an on-state to an off-state, as illustrated in FIG. 11C and FIG. 11D.

In providing the n-type semiconductor region 128, there is an advantage of being able to increase the electric potential $V_2$ and the capacitance $C_{TX}$ of the potential well 150 without increasing the n-type impurity concentration of the n-type semiconductor region 118 of the holding portion MEM. Since the depleting voltage of the holding portion MEM can be reduced by suppressing the increase of the n-type impurity concentration of the he n-type semiconductor region 118 of the holding portion MEM, charge transfer from the holding portion MEM to the floating diffusion FD can be performed at a lower voltage.

The charge amount $Q_{GS}$ that can be held in the potential well 150 in a state where the transfer transistor M1 is in an on-state can be increased when the n-type impurity concentration of the n-type semiconductor region 128 is increased. From another point of view, by increasing the n-type impurity concentration of the n-type semiconductor region 128, it is possible to reduce the area of a region where the n-type semiconductor region 128 is formed while maintaining the charge amount $Q_{GS}$ that can be held in the potential well 150. That is, the impurity concentration of the n-type semiconductor region 128 can be set so that the charge amount $Q_{GS}$ is a predetermined value. In this case, since the gate width and the gate length of the gate electrode TX1 can be reduced, this allows for a finer pixel 12 and thus improves the resolution of the imaging device. The same advantage can be obtained by increasing the gate voltage in a state where the transfer transistor M1 is in an on-state instead of increasing the n-type impurity concentration of the n-type semiconductor region 128.

Alternatively, the charge amount $Q_{GS}$ that can be held in the potential well 150 in a state where the transfer transistor M1 is in an on-state can be increased when the region where the n-type semiconductor region 128 is formed is widened. From another point of view, by widening the region where the n-type semiconductor region 128 is formed, it is possible to reduce the n-type impurity concentration of the n-type semiconductor region 128 while maintaining the charge amount $Q_{GS}$ that can be held in the potential well 150. That is, the area of the region where the n-type semiconductor region 128 is formed can be set so that the charge amount $Q_{GS}$ is a predetermined value. In this case, the n-type impurity concentration immediately below the gate electrode TX1 is reduced, and thereby characteristics when it is dark, such as a dark current, a white flaw, or the like can be improved.

As discussed above, according to the present embodiment, in the imaging device having a global electronic shutter function, it is possible to effectively suppress a reverse flow of charges when signal charges are transferred from the photoelectric converter to the charge holding portion and acquire a high quality image having good linearity characteristics.

Fourth Embodiment

An imaging system according to a fourth embodiment of the present invention will be described with reference to FIG. 12. FIG. 12 is a block diagram illustrating a general configuration of the imaging system according to the present embodiment.

The imaging devices 200 described in the above first to third embodiments are applicable to various imaging systems. As an applicable imaging system is not particularly limited and may be various devices such as a digital still camera, a digital camcorder, a surveillance camera, a copy machine, a fax machine, a mobile phone, an on-vehicle camera, an observation satellite, or the like, for example. Further, a camera module having an optical system such as lenses and an imaging device is included in the imaging system. FIG. 12 illustrates a block diagram of a digital still camera as an example of the above devices.

As illustrated in FIG. 12, an imaging system 300 includes an imaging optical system 302, a CPU 310, a lens control unit 312, an imaging device control unit 314, an image processing unit 316, an aperture shutter control unit 318, a display unit 320, an operating switch 322, and a storage medium 324.

The imaging optical system 302 is an optical system used for forming an optical image of an object and includes a lens group and an aperture 304 or the like. The aperture 304 has a function of light amount adjustment at the time of capturing by adjusting the aperture diameter and, in addition, a function as a shutter used for exposure time adjustment when capturing a static image. The lens group and the aperture 304 are held so as to be retractable along the optical axis direction, and a magnification function (zoom function) or a focus adjustment function is implemented by the interlocking operation thereof. The imaging optical system 302 may be integrated with the imaging system or may be an image capturing lens that can be attached to the imaging system.

An imaging device 200 is arranged in an image space of the imaging optical system 302 so that the image capturing plane is located therein. The imaging device 200 is the imaging device 200 described in the first to third embodiments and includes a CMOS sensor (pixel region 10) and the peripheral region thereof (peripheral circuit region). The imaging device 200 forms a two-dimensional single-plate color sensor in which a plurality of pixels having photoelectric converters are two-dimensionally arranged and color filters are arranged to these pixels. The imaging device 200 photoelectrically converts an object image captured by the imaging optical system 302 and outputs the object image as an image signal or a focus detection signal.

The lens control unit 312 is used to control forward and backward driving of the lens group of the imaging optical system 302 to perform magnification operation or focus adjustment and is formed of a circuit and a processing device configured to implement such a function. The aperture shutter control unit 318 changes the aperture diameter of the aperture 304 (changes an aperture value) to adjust a capturing light amount and is formed of a circuit and a processing device configured to implement such a function.

The CPU 310 is a control device inside a camera that is responsible for various control of the camera unit and includes a calculation unit, a ROM, a RAM, an analog-to-digital (A/D) converter, a digital-to-analog (D/A) converter, a communication interface circuit, or the like. The CPU 310 controls the operation of each unit within the camera in accordance with a computer program stored in the ROM or the like and performs a series of capturing operations such as AF including detection of a focus state (focus detection) of the imaging optical system 302, capturing, image processing, storage, and the like. The CPU 310 is also a signal processing unit.

The imaging device control unit 314 is for controlling the operation of the imaging device 200, performing A/D conversion on a signal output from the imaging device 200, and transmitting the converted digital signal to the CPU 310 and is formed of a circuit and a control device configured to implement such a function. The A/D conversion function may be provided in the imaging device 200. The image processing unit 316 is for performing image processing such as gamma conversion, color interpolation, or the like on the signal obtained after A/D conversion to generate an image signal and is formed of a circuit and a control device configured to implement such a function. The display unit 320 is a display device such as a liquid crystal display (LCD) and displays information on a capturing mode of the camera, a preview image before capturing, a review image after capturing, a focusing state at focus detection, or the like. The operating switch 322 is formed of a power supply switch, a release (capturing trigger) switch, a zoom operation switch, a capturing mode selection switch, or the like. The storage medium 324 is for storing captured images or the like, which may be built in the imaging system or may be removable such as a memory card.

The imaging system 300 to which the imaging device 200 described in the first to third embodiments is applied is configured in such a way, and thereby a high performance imaging system that can acquire a good image with high linearity characteristics can be realized.

Fifth Embodiment

Figure 13A:
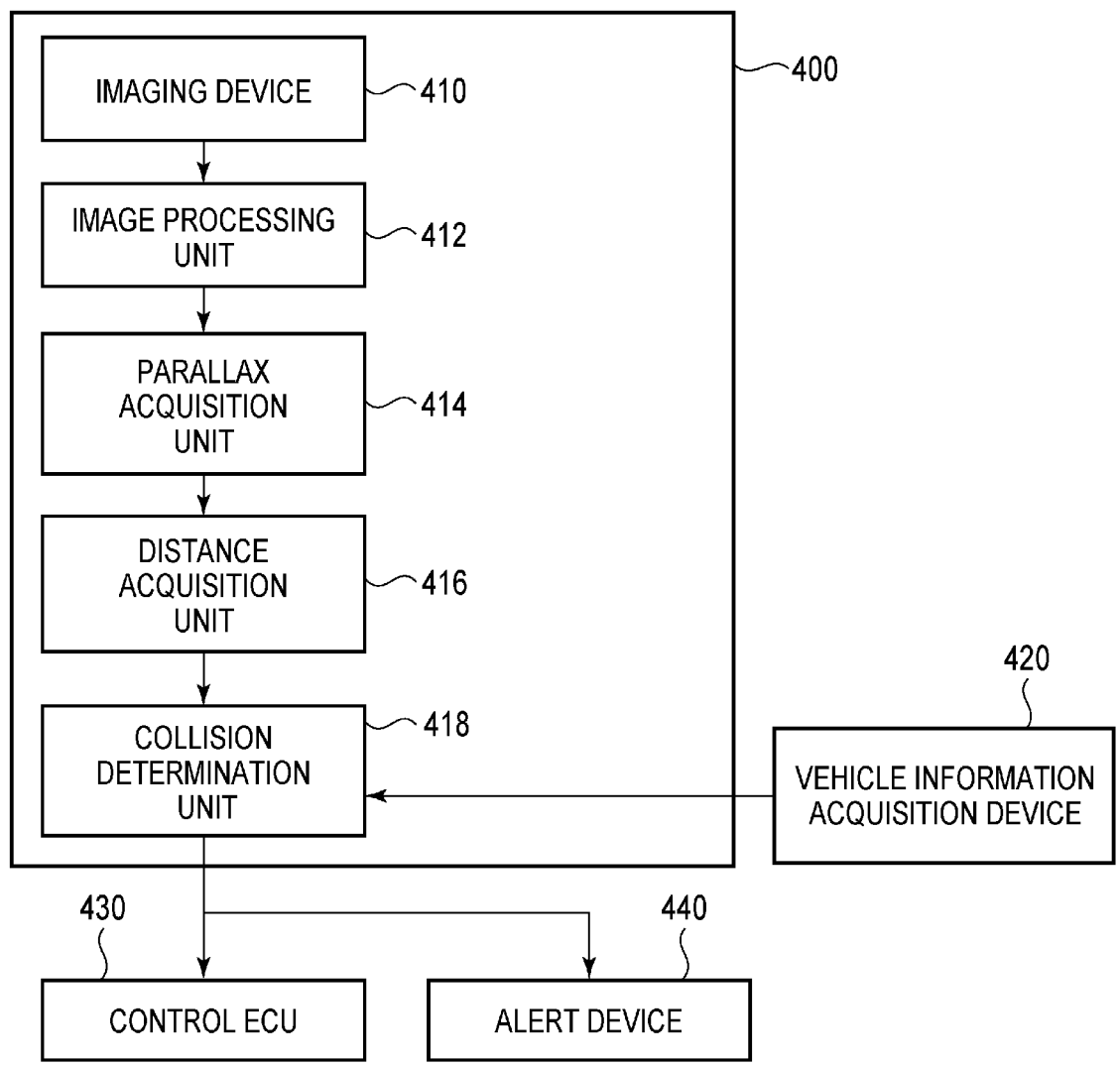
FIG. 13A is a diagram illustrating a configuration example of an imaging system according to a fifth embodiment of the present invention.
Figure 13B:
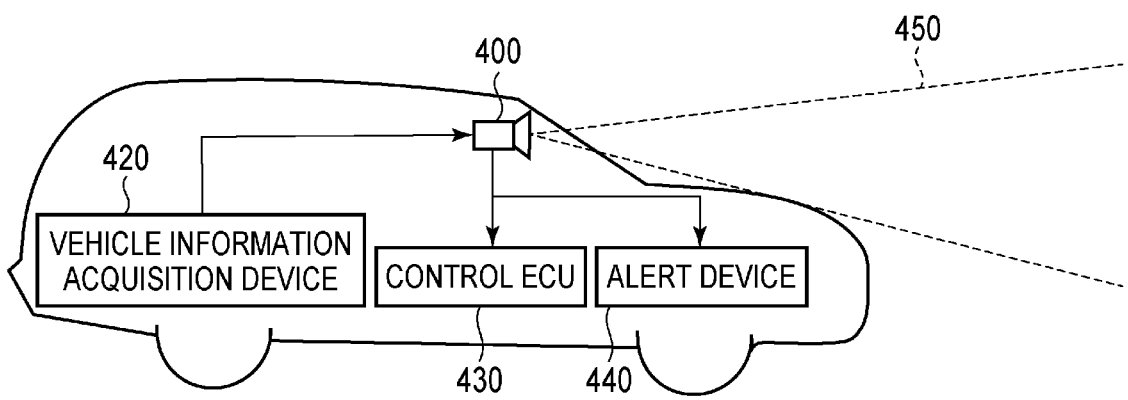
FIG. 13B is a diagram illustrating a configuration example of a movable object according to the fifth embodiment of the present invention.

An imaging system and a movable object according to a fifth embodiment of the present invention will be described with reference to FIG. 13A and FIG. 13B. FIG. 13A and is a diagram illustrating the configuration of the imaging system according to the present embodiment. FIG. 13B is a diagram illustrating the configuration of the movable object according to the present embodiment.

FIG. 13A illustrates an example of an imaging system 400 related to an on-vehicle camera. The imaging system 400 includes an imaging device 410. The imaging device 410 is any of the imaging devices 200 described above in the first to third embodiments. The imaging system 400 includes an image processing unit 412 that performs image processing and a parallax acquisition unit 414 that calculates a parallax (phase difference between parallax images) from the plurality of image data acquired by the imaging device 410. Further, the imaging system 400 includes a distance acquisition unit 416 that calculates a distance to an object based on the calculated parallax and a collision determination unit 418 that determines whether or not there is a collision possibility based on the calculated distance. Here, the parallax acquisition unit 414 or the distance acquisition unit 416 is an example of a distance information acquisition unit that acquires distance information on the distance to an object. That is, the distance information is information on a parallax, a defocus amount, a distance to an object, or the like. The collision determination unit 418 may use any of the distance information to determine the collision possibility. The distance information acquisition unit may be implemented by dedicatedly designed hardware or may be implemented by a software module. Further, a Field Programmable Gate Array (FPGA), an Application Specific Integrated Circuit (ASIC), or the like may be used for implementation, or a combination thereof may be used for implementation.

The imaging system 400 is connected to a vehicle information acquisition device 420 and can acquire vehicle information such as a vehicle speed, a yaw rate, a steering angle, or the like. Further, the imaging system 400 is connected to a control ECU 430, which is a control device that outputs a control signal for causing a vehicle to generate braking force based on a determination result by the collision determination unit 418. That is, the control ECU 430 is an example of a movable object control unit for controlling a movable object based on the distance information. Further, the imaging system 400 is also connected to an alert device 440 that issues an alert to the driver based on a determination result by the collision determination unit 418. For example, when the collision probability is high as the determination result of the collision determination unit 418, the control ECU 430 performs vehicle control to avoid a collision or reduce damage by applying a brake, pushing back an accelerator, suppressing engine power, or the like. The alert device 440 alerts a user by sounding an alert such as a sound, displaying alert information on a display of a car navigation system or the like, providing vibration to a seat belt or a steering wheel, or the like.

In the present embodiment, an area around a vehicle, for example, a front area or a rear area is captured by using the imaging system 400. FIG. 13B illustrates the imaging system 400 in a case of capturing a front area of a vehicle (a capturing region 450). The vehicle information acquisition device 420 transmits instructions to cause the imaging system 400 to operate and perform capturing. When the imaging device 200 described in the first to third embodiments is used as the imaging device 410, the imaging system 400 of the present embodiment can further improve the ranging accuracy.

Although an example of control for avoiding a collision to another vehicle has been described in the description above, it is applicable to automatic driving control for following another vehicle, automatic driving control for not going out of a traffic lane, or the like. Furthermore, the imaging system is not limited to a vehicle such as the subject vehicle and can be applied to a movable object (moving apparatus) such as a ship, an airplane, or an industrial robot, for example. In addition, the imaging system can be widely applied to a device which utilizes object recognition, such as an intelligent transportation system (ITS), without being limited to movable objects.

Modified Embodiments

The present invention is not limited to the embodiments described above, and various modifications are possible.

For example, an example in which a part of the configuration of any of the embodiments is added to another embodiment or an example in which a part of the configuration of any of the embodiments is replaced with a part of the configuration of another embodiment is one of the embodiments of the present invention.

Further, the circuit configuration of the pixel 12 is not limited to that illustrated in FIG. 2, and various modifications are possible as appropriate. The plan layout or the cross-sectional structure of the pixel 12 is also not limited to that illustrated in FIG. 3 and FIG. 4, and various modifications are possible as appropriate.

Further, the imaging systems illustrated in the fourth and fifth embodiments are examples of an imaging system to which the imaging device of the present invention may be applied, the imaging system to which the imaging device of the present invention can be applied is not limited to the configuration illustrated in FIG. 12 and FIG. 13A.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-024935, filed Feb. 15, 2018 which is hereby incorporated by reference herein in its entirety.

What is claimed is:

1. An imaging device comprising:
a plurality of pixels each including
a photoelectric converter that generates charges by photoelectric conversion;
a first transfer transistor that transfers charges of the photoelectric converter to a first holding portion;
a second transfer transistor that transfers charges of the first holding portion to a second holding portion and
an amplifier unit that outputs a signal based on charges held by the second holding portion,
wherein the first transfer transistor is configured to form a potential well for charges between the photoelectric converter and the first holding portion when the first transistor is in an on-state, and
wherein a maximum charge amount $Q_{PD}$ generated by the photoelectric converter during one exposure period, a saturation charge amount $Q_{MEM\_SAT}$ of the first holding portion, and a maximum charge amount $Q_{GS}$ that can be held in the potential well are in a relationship of:

$$Q_{PD} < Q_{GS} \leq Q_{MEM\_SAT}.$$

2. The imaging device according to claim 1 further comprising a transfer control unit configured to control the first transfer transistor so as to transfer charges generated by the photoelectric converter during the one exposure period from the photoelectric converter to the first holding portion by N times of transfer operations,
wherein the charge amount $Q_{PD}$ is expressed by:

$$Q_{PD} = Q_{PD\_SAT} \times N,$$

where a saturation charge amount of the photoelectric converter is $Q_{PD\_SAT}$.

3. The imaging device according to claim 1, wherein the potential well is formed on the first holding portion side of a region between the photoelectric converter and the first holding portion.

4. The imaging device according to claim 1,
wherein the photoelectric converter includes a first semiconductor region of a first conductivity type and a second semiconductor region of a second conductivity type that is provided in contact with a bottom of the first semiconductor region and corresponds to an accumulation layer of the charges,
wherein the first holding portion includes a third semiconductor region of the first conductivity type and a fourth semiconductor region of the second conductivity type that is provided in contact with a bottom of the third semiconductor region and corresponds to a holding layer of the charges, and
wherein an impurity concentration of the fourth semiconductor region is higher than an impurity concentration of the second semiconductor region.

5. The imaging device according to claim 4, wherein the second semiconductor region and the fourth semiconductor region have a region overlapping with a gate electrode of the first transfer transistor in a plan view.

6. The imaging device according to claim 4 further comprising a fifth semiconductor region of the second conductivity type provided in contact with an end on the photoelectric converter side of the fourth semiconductor region,
wherein an impurity concentration of the fifth semiconductor region is higher than the impurity concentration of the fourth semiconductor region.

7. The imaging device according to claim 6, wherein an end of a region where the fifth semiconductor region and a gate electrode of the first transfer transistor to overlap each other in a plan view is located closer to the photoelectric converter side than an end of a region where the fourth semiconductor region and the gate electrode overlap each other in a plan view.

8. The imaging device according to claim 6, wherein the impurity concentration of the fifth semiconductor region is set so that the charge amount $Q_{GS}$ is a predetermined value.

9. The imaging device according to claim 6, wherein a region where the fifth semiconductor region is formed is set so that the charge amount $Q_{GS}$ is a predetermined value.

10. The imaging device according to claim 1, wherein the charge amount $Q_{GS}$ is controlled by a voltage applied to a gate of the first transfer transistor.

11. An imaging system comprising:
the imaging device according to claim 1; and
a signal processing unit that processes a signal output from the imaging device.

12. A movable object comprising:
the imaging device according to claim 1;
a distance information acquisition unit that acquires, from a parallax image based on signals output from the pixels of the imaging device, distance information on a distance to an object; and
a control unit that controls the movable object based on the distance information.

* * * * *